United States Patent
Wada et al.

(10) Patent No.: US 9,787,061 B2
(45) Date of Patent: Oct. 10, 2017

(54) SEMICONDUCTOR LASER ELEMENT

(71) Applicant: SONY CORPORATION, Tokyo (JP)

(72) Inventors: Shinichi Wada, Kanagawa (JP);
Masaru Kuramoto, Kanagawa (JP);
Hideki Watanabe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/034,640

(22) PCT Filed: Nov. 6, 2014

(86) PCT No.: PCT/JP2014/079409
§ 371 (c)(1),
(2) Date: May 5, 2016

(87) PCT Pub. No.: WO2015/076110
PCT Pub. Date: May 28, 2015

(65) Prior Publication Data
US 2016/0268777 A1 Sep. 15, 2016

(30) Foreign Application Priority Data

Nov. 19, 2013 (JP) .................................. 2013-239103

(51) Int. Cl.
G01S 5/00 (2006.01)
H01S 5/343 (2006.01)
(Continued)

(52) U.S. Cl.
CPC ........ *H01S 5/34333* (2013.01); *H01S 5/0425* (2013.01); *H01S 5/0602* (2013.01);
(Continued)

(58) Field of Classification Search
CPC .. H01S 5/34333; H01S 5/0425; H01S 5/0602; H01S 5/065; H01S 5/141;
(Continued)

(56) References Cited

U.S. PATENT DOCUMENTS

2010/0046566 A1* 2/2010 Kudo ..................... B82Y 20/00
372/45.01
2011/0037088 A1* 2/2011 Oya ....................... H01L 33/40
257/94
(Continued)

FOREIGN PATENT DOCUMENTS

JP 2004-007002 A 1/2004
JP 2008-047692 A 2/2008
(Continued)

*Primary Examiner* — Joshua King
*Assistant Examiner* — Delma R Forde
(74) *Attorney, Agent, or Firm* — Chip Law Group

(57) ABSTRACT

A semiconductor laser element includes a stacked structure body, a second electrode 62, and a first electrode 61; a ridge stripe structure 71 formed of at least part of the stacked structure body is formed; a side structure body 72 formed of the stacked structure body is formed on both sides of the ridge stripe structure 71; the second electrode 62 is separated into a first portion for sending a direct current to the first electrode via a light emitting region and a second portion 62B for applying an electric field to a saturable absorption region; a protection electrode 81 is formed on a portion adjacent to the second portion 62B of the second electrode of at least one side structure body 72; and an insulating layer 56 made of an oxide insulating material is formed to extend from on a portion of the ridge stripe structure 71 to on a portion of the side structure body 72, on which portions neither the second electrode nor the protection electrode 81 is formed.

9 Claims, 23 Drawing Sheets

(51) Int. Cl.
*H01S 5/065* (2006.01)
*H01S 5/042* (2006.01)
*H01S 5/06* (2006.01)
*H01S 5/14* (2006.01)
*H01S 5/22* (2006.01)
*H01S 5/028* (2006.01)

(52) U.S. Cl.
CPC .............. *H01S 5/065* (2013.01); *H01S 5/141* (2013.01); *H01S 5/2214* (2013.01); *H01S 5/0287* (2013.01)

(58) Field of Classification Search
CPC ...... H01S 5/2214; H01S 5/0287; H01S 5/028; H01S 5/22; H01S 5/2206; H01S 5/2216; H01S 5/2219; H01S 5/322; H01S 5/0601; H01S 5/0609; H01S 5/2018; H01S 5/2022; H01S 5/18311; H01S 5/2231; H01S 5/0265; H01S 5/06251; H01S 5/06253; H01S 5/042; H01S 5/06; H01S 5/343; H01S 5/0658
See application file for complete search history.

(56) References Cited

U.S. PATENT DOCUMENTS

| | | | | |
|---|---|---|---|---|
| 2011/0216788 | A1* | 9/2011 | Oki | H01S 3/11 372/18 |
| 2012/0002271 | A1* | 1/2012 | Kuramoto | H01S 5/1064 359/344 |
| 2014/0307750 | A1* | 10/2014 | Kono | B82Y 20/00 372/18 |
| 2015/0043603 | A1* | 2/2015 | Kuramoto | H01S 5/22 372/45.01 |
| 2015/0085891 | A1* | 3/2015 | Watanabe | H01S 5/141 372/50.11 |
| 2017/0047480 | A1* | 2/2017 | Watanabe | H01L 33/14 |

FOREIGN PATENT DOCUMENTS

| | | |
|---|---|---|
| JP | 2011-238749 A | 11/2011 |
| JP | 2012-147020 A | 8/2012 |

* cited by examiner

FIG. 16A [STEP-110]
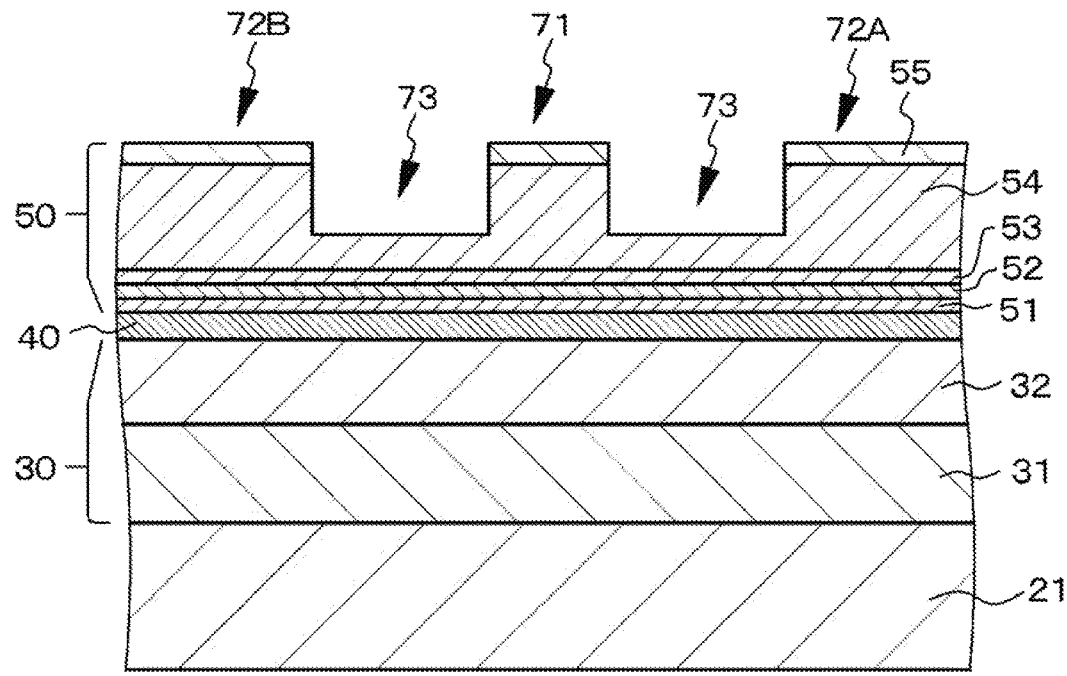
FIG. 16B [STEP-120]
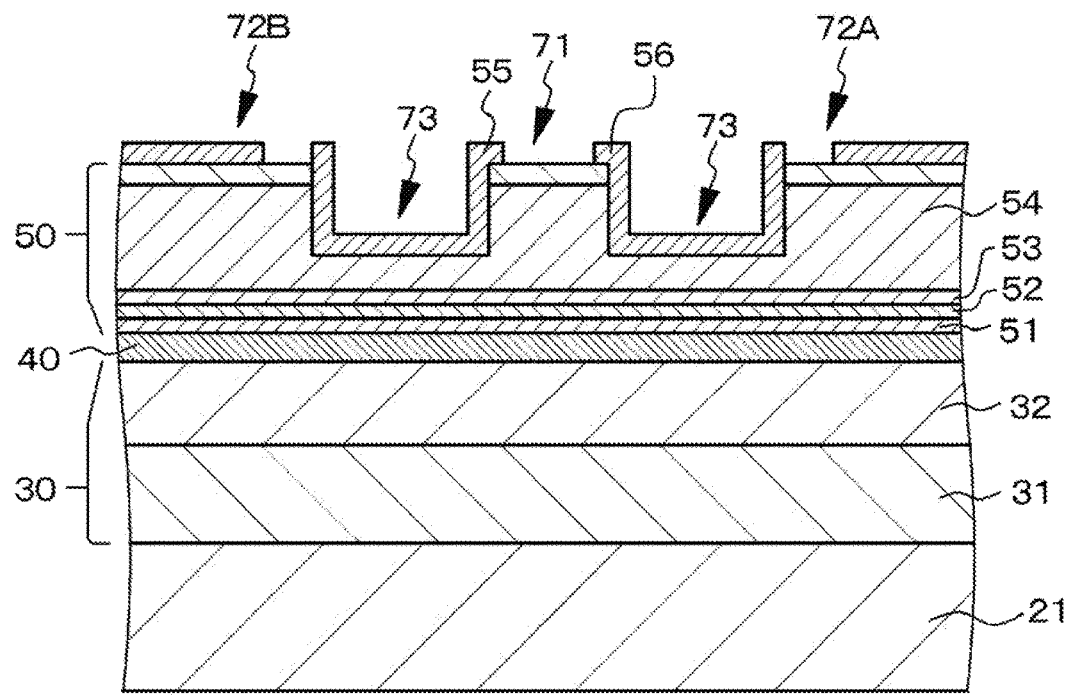

FIG. 17 [STEP-130]
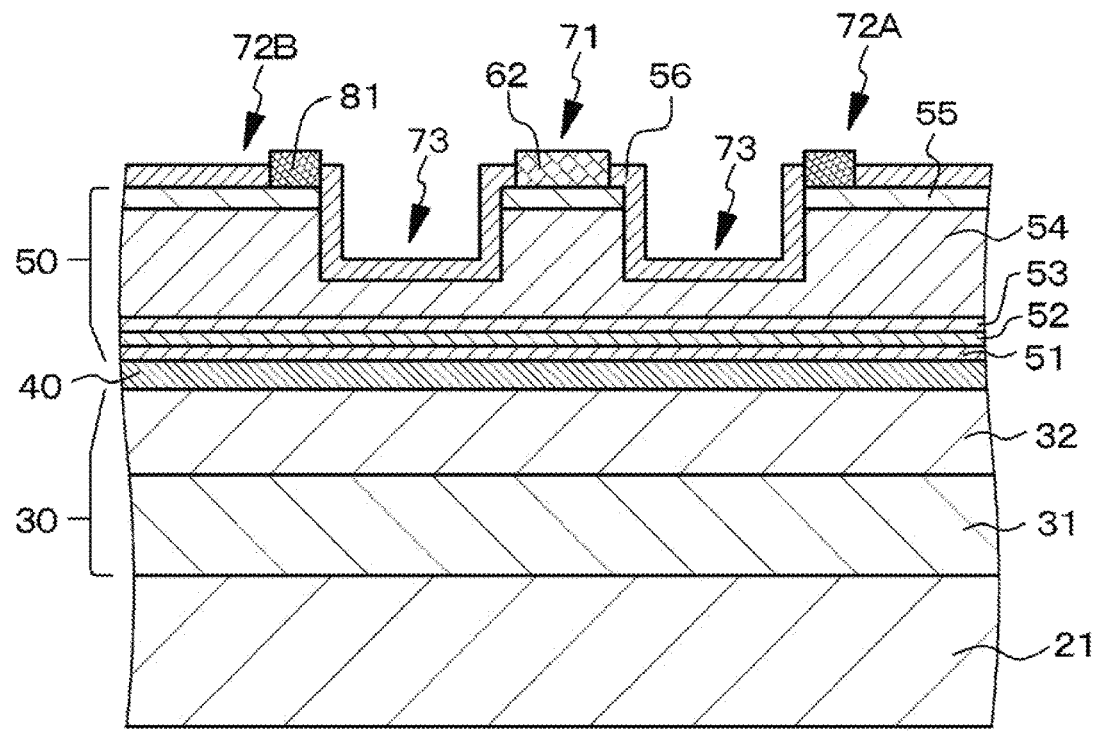

TEM-EDS ANALYSIS RESULT

※INFLUENCE OF SAMPLE HOLDER

BF-STEM IMAGE

US 9,787,061 B2

SEMICONDUCTOR LASER ELEMENT

CROSS REFERENCE TO RELATED APPLICATIONS

This application is a U.S. National Phase of International Patent Application No. PCT/JP2014/079409 filed on Nov. 6, 2014, which claims priority benefit of Japanese Patent Application No. JP 2013-239103 filed in the Japan Patent Office on Nov. 19, 2013. Each of the above-referenced applications is hereby incorporated herein by reference in its entirety.

TECHNICAL FIELD

The present disclosure relates to a semiconductor laser element.

BACKGROUND ART

A high-power ultrashort pulse semiconductor laser element made of a GaN-based compound semiconductor and having a light emitting wavelength in the 405 nm band holds promise as a light source of a volumetric optical disk system, which has potential as an optical disk system in the next generation to the Blu-ray (registered trademark) optical disk system, and as a light source required in medical fields, bioimaging fields, etc. As the method for producing short pulse light in a semiconductor laser element, mainly two methods of gain-switching and mode-locking are known; and the mode-locking is further categorized into active mode-locking and passive mode-locking. To produce light pulses on the basis of active mode-locking, it is necessary to configure an external resonator using mirrors or lenses and perform radio-frequency (RF) modulation on the semiconductor laser element. On the other hand, in passive mode-locking, by utilizing the self-pulsation operation of the semiconductor laser element, light pulses can be produced by simple DC driving.

To cause the semiconductor laser element to perform self-pulsation operation, it is necessary to provide a light emitting region and a saturable absorption region in the semiconductor laser element. Here, according to the arrangement state of the light emitting region and the saturable absorption region, the semiconductor laser element can be categorized into a saturable absorber layer (SAL) type or a weakly index guide (WI) type in which the light emitting region and the saturable absorption region are arranged in the vertical direction and a bi-section type in which the light emitting region and the saturable absorption region are juxtaposed in the resonator direction. The bi-section type semiconductor laser element is known from JP 2004-007002A and JP 2008-047692A, for example. A bi-section type GaN-based semiconductor laser element is considered to have a larger saturable absorption effect and be capable of producing a light pulse with a narrower width than the SAL type semiconductor laser element.

The bi-section type semiconductor laser element includes, for example, as shown in FIG. 18, which is a schematic cross-sectional view along the direction orthogonal to the direction in which the resonator extends (a schematic cross-sectional view taken along the YZ plane, i.e., a schematic cross-sectional view along arrows I-I in FIG. 19 and FIG. 20), in FIG. 19, which is a schematic end view along the direction in which the resonator extends (a schematic end view taken along the XZ plane, i.e., a schematic end view along arrows II-II in FIG. 18 and FIG. 20), and in FIG. 20, which is a schematic diagram of the semiconductor laser element as viewed from above, (a) a stacked structure body in which a first compound semiconductor layer 30 having a first conductivity type and made of a compound semiconductor, a third compound semiconductor layer 40 that forms a light emitting region 41 and a saturable absorption region 42 made of a compound semiconductor, and a second compound semiconductor layer 50 having a second conductivity type different from the first conductivity type and made of a compound semiconductor are sequentially stacked, (b) a second electrode 62, and (c) a first electrode 61 electrically connected to the first compound semiconductor layer 30. The bi-section type semiconductor laser element has what is called a double-ridge structure in which a ridge stripe structure 71 formed of at least part of the stacked structure body is formed and a side structure body 72 (72A and 72B) formed of the stacked structure body is formed on both sides of the ridge stripe structure 71. The second electrode 62 formed on the second compound semiconductor layer 50 that forms the ridge stripe structure 71 is separated by an isolation trench 62C into a first portion 62A for sending a direct current to the first electrode 61 via the light emitting region 41 to create a forward bias state and a second portion 62B for applying an electric field to the saturable absorption region 42.

An insulating film 56 made of an oxide insulating material, such as $SiO_x$, is formed to extend from on a portion of the ridge stripe structure 71 to on a portion of the side structure body 72, on which portions the second electrode 62 is not formed. The first portion 62A of the second electrode 62 is covered by a first lead-out wiring layer 63 provided on the insulating film 56 that is formed to extend from on the portion of the ridge stripe structure 71 to on the portion of the side structure body 72, and the second portion 62B of the second electrode 62 is covered by a second lead-out wiring layer 64 provided on the insulating film 56 that is formed to extend from the other side structure body 72B, over the ridge stripe structure 71, to the one side structure body 72A. A wire bonding layer 65 extending from the second lead-out wiring layer 64 is provided on the insulating film 56 formed on the one side structure body 72A. In FIG. 20, the first lead-out wiring layer 63, the second lead-out wiring layer 64, and the wire bonding layer 65 are shaded in order to show them clearly, and the first portion 62A and the second portion 62B of the second electrode are shown as well. In the first lead-out wiring layer 63 and the wire bonding layer 65, a gold wire, for example, is wire-bonded to the area enclosed by the dotted circle. Here, the reference numeral 73 represents a recess provided between the ridge stripe structure 71 and the side structure body 72, and the reference numeral 21 represents a substrate (specifically, an n-type GaN substrate, for example).

CITATION LIST

Patent Literature

Patent Literature 1: JP 2004-007002A
Patent Literature 2: JP 2008-047692A

SUMMARY OF INVENTION

Technical Problem

In the semiconductor laser element having a double-ridge structure, in many cases, the quality of a portion 56A of the insulating film formed in the shoulder area of the side structure body 72 (the area enclosed by the circle in FIG. 18) is not high, and it is likely that a chemically unstable film will be formed. When the voltages applied to the first portion 62A and the second portion 62B of the second electrode 62 and the first electrode 61 are denoted by $V_{21}$, $V_{22}$, and $V_1$, respectively, there are usually relationships of $$V_{22} < V_1 < V_{21},$$

and $V_1$ is often set to $V_1$=0 volts. If such a low-quality portion 56A of the insulating film exists, although no problem arises in the shoulder area of the side structure body 72 facing the first portion 62A of the second electrode 62 because the voltage of $V_{21}$ (>$V_1$) of the first portion 62A of the second electrode 62 is applied, the problems described below arise in the shoulder area of the side structure body 72 that faces the second portion 62B of the second electrode 62 because the voltage of $V_{22}$ (<$V_1$) of the second portion 62B of the second electrode 62 is applied. That is, in the low-quality portion 56A of the insulating film in the shoulder area of the side structure body 72 that faces the second portion 62B of the second electrode 62, the bond between atoms in the insulating film is weak and is likely to be cut, and the constituent atoms are likely to be ionized. The insulating film is usually made of an oxide; and the oxygen therein may be ionized and diffused to the surface of the compound semiconductor layer directly under the low-quality portion 56A of the insulating film due to the electric field generated between the second lead-out wiring layer 64 and the first electrode 61, and may cause anode oxidation reaction together with holes accumulated in the compound semiconductor layer. Consequently, the compound semiconductor forming the side structure body 72 may be oxidized to produce an oxide derived from the compound semiconductor, and volume expansion may occur to cause disconnection in the second lead-out wiring layer 64 formed above the compound semiconductor. Scanning electron microscope photographs of this state are shown in FIG. 21A, FIG. 21B, and FIG. 21C. Here, FIG. 21A is a scanning electron microscope photograph of the ridge stripe structure 71 and the side structure body 72 (72A and 72B) provided on both sides of the ridge stripe structure 71. FIG. 21B is a scanning electron microscope photograph of an enlarged image of a portion of the side structure body 72B in FIG. 21A, and FIG. 21C is a scanning electron microscope photograph of an enlarged image of a portion of the side structure body 72A in FIG. 21A. The white band-like portion extending approximately in the horizontal direction in FIG. 21A and the white band-like portions extending approximately in a mount shape in FIG. 21B and FIG. 21C are the second lead-out wiring layer 64. Disconnection has occurred in the second lead-out wiring layer 64. The results of component analysis of the volume-expanded portion (the results of component analysis based on energy dispersive X-ray spectrometry using a scanning transmission electron microscope) are shown in FIG. 22A, FIG. 22B, and FIG. 22C; and it is shown that the volume-expanded portion is oxide of Ga. The analysis result shown in FIG. 22A is the analysis result at "point 2" shown in FIG. 23 (the same as FIG. 21C), the analysis result shown in FIG. 22B is the analysis result at "point 1" shown in FIG. 23, and the analysis result shown in FIG. 22C is the analysis result at "point 3" shown in FIG. 23. Here, "point 1" is a volume-expanded portion, "point 2" is a volume-expanded portion but in a peripheral area, and "point 3" is a not-volume-expanded portion. It has been found that, as a result of the occurrence of such a phenomenon, a voltage cannot be applied to the saturable absorption region 42 and mode-locking operation cannot be performed.

During the manufacturing process of the semiconductor laser element and the use of an electronic apparatus in which the semiconductor laser element is incorporated, a surge current resulting from a pulsed current due to static electricity (hereinafter, referred to as an electro-static discharge (ESD) current) may flow from the outside. If such a surge current flows from the wire bonding layer 65 to the second portion 62B of the second electrode 62, insulation breakdown may occur in the low-quality portion 56A of the insulating film formed in the shoulder area of the side structure body 72, and consequently damage may occur in the semiconductor laser element.

Thus, a first object of the present disclosure is to provide a semiconductor laser element having a configuration and a structure in which damage is less likely to occur in the side structure body facing the second portion of the second electrode. A second object of the present disclosure is to provide a semiconductor laser element having a configuration and a structure in which a surge current is less likely to flow toward the second portion of the second electrode.

Solution to Problem

According to a first aspect or a second aspect of the present disclosure, there is provided a semiconductor laser element including: (a) a stacked structure body in which a first compound semiconductor layer having a first conductivity type and made of a compound semiconductor, a third compound semiconductor layer configured to form a light emitting region and a saturable absorption region made of a compound semiconductor, and a second compound semiconductor layer having a second conductivity type different from the first conductivity type and made of a compound semiconductor are sequentially stacked; (b) a second electrode; and (c) a first electrode electrically connected to the first compound semiconductor layer. A ridge stripe structure formed of at least part of the stacked structure body is formed. A side structure body formed of the stacked structure body is formed on both sides of the ridge stripe structure. The second electrode formed on the second compound semiconductor layer forming the ridge stripe structure is separated into a first portion for sending a direct current to the first electrode via the light emitting region to create a forward bias state and a second portion for applying an electric field to the saturable absorption region.

In the semiconductor laser element according to the first aspect of the present disclosure for achieving the first object, a protection electrode is formed on a portion adjacent to the second portion of the second electrode of at least one of the side structure bodies. An insulating film made of an oxide insulating material is formed to extend from on a portion of the ridge stripe structure to on a portion of the side structure body, on which portions neither the second electrode nor the protection electrode is formed.

In the semiconductor laser element according to the second aspect of the present disclosure for achieving the second object, the first portion of the second electrode is covered by a first lead-out wiring layer formed on an insulating film. The second portion of the second electrode is covered by a second lead-out wiring layer formed on the insulating film. A wire bonding layer extending from the second lead-out wiring layer is provided on the insulating film formed on one of the side structure bodies. A surge protection electrode covered by the wire bonding layer is formed on a portion of the one of the side structure bodies located between a portion of the wire bonding layer where wire bonding is made and the second lead-out wiring layer.

Advantageous Effects of Invention

In the semiconductor laser element according to the first aspect of the present disclosure, a protection electrode is formed on a portion adjacent to the second portion of the second electrode of at least one side structure body. Therefore, even in the case where the quality of a portion of the insulating film formed in the shoulder area of the side structure body is low, when the voltage of $V_{22}$ ($<V_1$) of the second portion of the second electrode is applied, the voltage of $V_{22}$ ($<V_1$) is applied also to the protection electrode, and therefore the holes accumulated in the shoulder area of the side structure body of the insulating film are extracted to the protection electrode; consequently, the oxygen ions contained in the insulating film do not react with the compound semiconductor layer together with the accumulated holes. Therefore, anode oxidation reaction does not occur in the compound semiconductor layer directly under the insulating film. That is, the occurrence of a phenomenon in which the compound semiconductor forming the side structure body is oxidized to produce an oxide derived from the compound semiconductor and volume expansion occurs to cause disconnection in the second lead-out wiring layer formed above the compound semiconductor can be suppressed. Thus, a phenomenon in which a voltage cannot be applied to the saturable absorption region and mode-locking operation cannot be performed does not occur, and a semiconductor laser element having high reliability and a long lifetime can be provided. A reverse bias is applied to the third compound semiconductor layer that forms the side structure body, like in the saturable absorption region; therefore, current injection into the third compound semiconductor layer that forms the side structure body is not made, and the functions of the light emitting region and the saturable absorption region are not impaired. In regard to the noise characteristics and the pulse time width in the mode-locking operation, from test results a significant difference was not found between the presence of the protection electrode and the absence of the protection electrode.

In the semiconductor laser element according to the second aspect of the present disclosure, a surge protection electrode covered by the wire bonding layer is formed on a portion of one side structure body located between a portion of the wire bonding layer where wire bonding is made and the second lead-out wiring layer. Therefore, during the manufacturing process of the semiconductor laser element and the use of an electronic apparatus in which the semiconductor laser element is incorporated, even when a surge current resulting from an ESD current has flowed from the outside into the wire bonding layer where wire bonding is made, the surge current flows from the surge protection electrode to the first electrode via the side structure body. Thus, even when the quality of a portion of the insulating film formed in the shoulder area of the side structure body is low, the occurrence of insulation breakdown can be reliably prevented, and a semiconductor laser element having high reliability can be provided.

BRIEF DESCRIPTION OF DRAWINGS

FIG. 16A and FIG. 16B are schematic partial end views of a substrate etc. for describing a method for manufacturing the semiconductor laser element in Example 1.

FIG. 17 is a schematic partial end view of the substrate etc. for describing the method for manufacturing the semiconductor laser element in Example 1, continuing from FIG. 16B.

DESCRIPTION OF EMBODIMENTS

Figure 1:
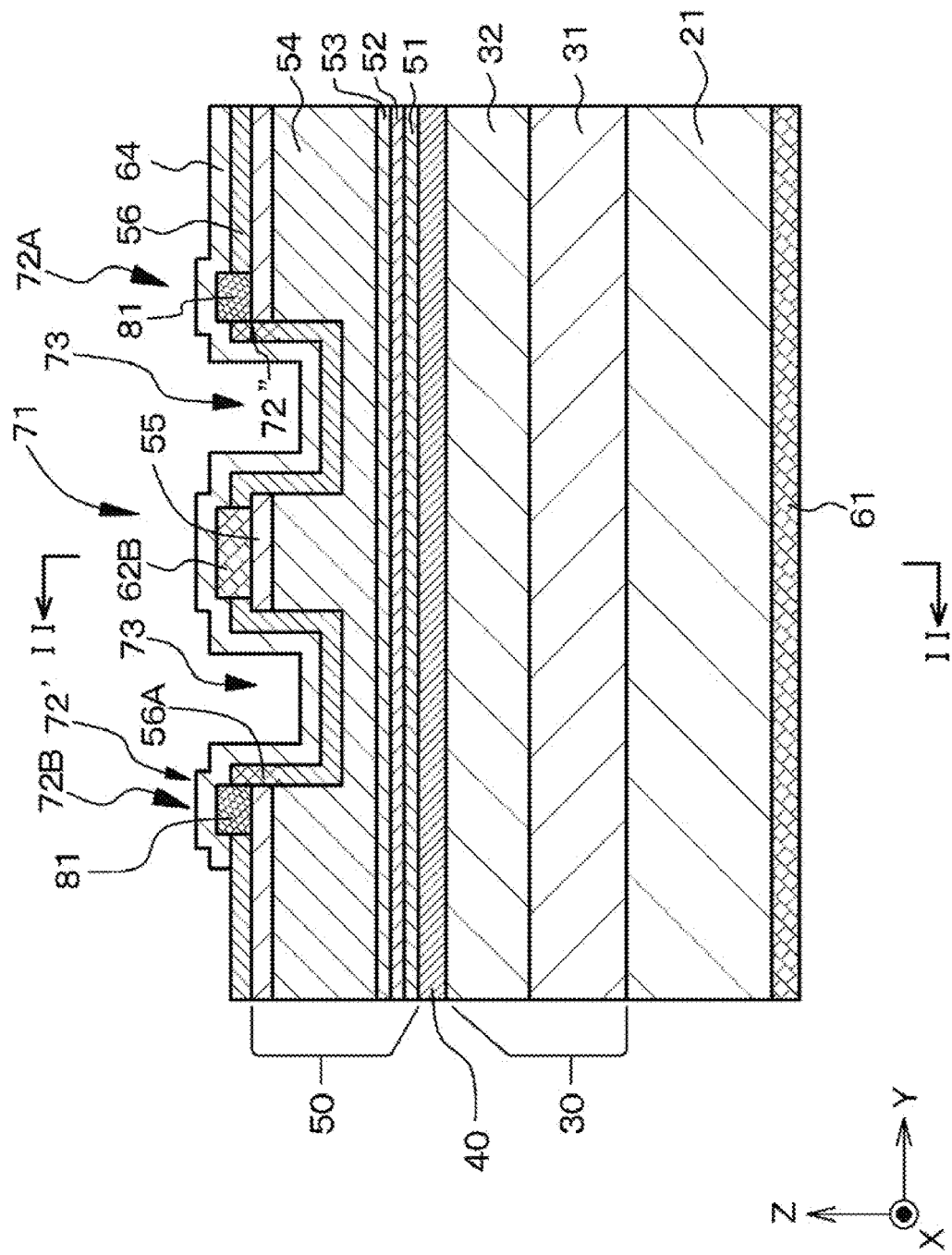
FIG. 1 is a schematic cross-sectional view of a semiconductor laser element of Example 1 along the direction orthogonal to the direction in which a resonator extends.

Hereinbelow, the present disclosure is described based on Examples with reference to the drawings, but the present disclosure is not limited to Examples and the various numerical values and materials in Examples are only examples. The description is given in the following order.
1. Overall description of the semiconductor laser element according to the first aspect and the second aspect of the present disclosure
2. Example 1 (the semiconductor laser element according to the first aspect of the present disclosure)
3. Example 2 (the semiconductor laser element according to the second aspect of the present disclosure), etc.

[Overall Description of the Semiconductor Laser Element According to the First Aspect and the Second Aspect of the Present Disclosure]

In the semiconductor laser element according to the first aspect and the second aspect of the present disclosure, a configuration in which the oxide insulating material is made of silicon oxide (SiOx) is possible. However, the configuration is not limited to such a configuration, and also aluminum oxide ($AlO_x$), tantalum oxide ($TaO_x$), and zirconium oxide ($ZrO_x$) may be given as the oxide insulating material. Alternatively, as the material that forms the insulating film, at least one material selected from the group consisting of $ZnO_x$, SiON, $HfO_x$, $ScO_x$, $YO_x$, $MgO_x$, $ThO_x$, and $BiO_x$ may be given. The insulating film may be a single-layer configuration or a multiple-layer configuration made of these materials. Here, the subscript "X" means that each oxide insulating material may have a composition deviated from the stoichiometry (stoichiometric composition). The insulating film can be formed by various PVD methods such as the vacuum deposition method and the sputtering method, or can be formed by various CVD methods. A silicon layer (specifically, an amorphous silicon layer, for example) may be formed on the insulating film. The silicon layer functions as a light absorbing layer; and by providing the silicon layer, the absorption for the first-order mode light is increased, and the transverse mode can be stabilized.

In the case where the insulating film is formed of $SiO_x$, the thickness of the insulating film made of $SiO_x$ may be $2 \times 10^{-8}$ m to $3 \times 10^{-7}$ m, preferably $2 \times 10^{-8}$ m to $2 \times 10^{-7}$ m. In the case where a silicon layer is formed on the insulating film made of $SiO_x$, the thickness of the insulating film made of $SiO_x$ may be $2 \times 10^{-8}$ m to $8 \times 10^{-8}$ m and the thickness of the silicon layer may be $5 \times 10^{-9}$ m or more; it is preferable that the thickness of the insulating film made of $SiO_x$ be $4 \times 10^{-8}$ m to $8 \times 10^{-8}$ m and the thickness of the silicon layer be $5 \times 10^{-9}$ m or more; and it is more preferable that the thickness of the insulating film made of $SiO_x$ be $4 \times 10^{-8}$ m to $8 \times 10^{-8}$ m and the thickness of the silicon layer be $2 \times 10^{-8}$ m or more.

In the case where the insulating film is formed of AlOx, the thickness of the insulating film made of $AlO_x$ may be $2 \times 10^{-8}$ m to $3 \times 10^{-7}$ m, preferably $2 \times 10^{-8}$ m to $2 \times 10^{-7}$ m. In the case where a silicon layer is formed on the insulating film made of AlOx, the thickness of the insulating film made of $AlO_x$ may be $2 \times 10^{-8}$ m to $1.0 \times 10^{-7}$ m and the thickness of the silicon layer may be $5 \times 10^{-9}$ m or more; it is preferable that the thickness of the insulating film made of $AlO_x$ be $4 \times 10^{-8}$ m to $1 \times 10^{-7}$ m and the thickness of the silicon layer be $5 \times 10^{-9}$ m or more; and it is more preferable that the thickness of the insulating film made of $AlO_x$ be $4 \times 10^{-8}$ m to $1 \times 10^{-7}$ m and the thickness of the silicon layer be $2 \times 10^{-8}$ m or more.

In the case where the insulating film is formed of $TaO_x$, the thickness of the insulating film made of $TaO_x$ may be $2 \times 10^{-8}$ m to $5 \times 10^{-7}$ m, preferably $2 \times 10^{-8}$ m to $4 \times 10^{-7}$ m. In the case where a silicon layer is formed on the insulating film made of $TaO_x$, the thickness of the insulating film made of $TaO_x$ may be $2 \times 10^{-8}$ m to $2 \times 10^{-7}$ m and the thickness of the silicon layer may be $5 \times 10^{-9}$ m or more; it is preferable that the thickness of the insulating film made of $TaO_x$ be $2 \times 10^{-8}$ m to $1 \times 10^{-7}$ m and the thickness of the silicon layer be $5 \times 10^{-9}$ m or more; and it is more preferable that the thickness of the insulating film made of $TaO_x$ be $2 \times 10^{-8}$ m to $1 \times 10^{-7}$ m and the thickness of the silicon layer be $2 \times 10^{-8}$ m or more.

In the case where the insulating film is formed of $ZrO_x$, the thickness of the insulating film made of $ZrO_x$ may be $2 \times 10^{-8}$ m to $3 \times 10^{-7}$ m, preferably $2 \times 10^{-8}$ m to $2 \times 10^{-7}$ m. In the case where a silicon layer is formed on the insulating film made of $ZrO_x$, the thickness of the insulating film made of $ZrO_x$ may be $2 \times 10^{-8}$ m to $2 \times 10^{-7}$ m and the thickness of the silicon layer may be $5 \times 10^{-9}$ m or more; it is preferable that the thickness of the insulating film made of $ZrO_x$ be $3 \times 10^{-8}$ m to $1.1 \times 10^{-7}$ m and the thickness of the silicon layer be $5 \times 10^{-9}$ m or more; and it is more preferable that the thickness of the insulating film made of $ZrO_x$ be $6 \times 10^{-8}$ m to $1.1 \times 10^{-7}$ m and the thickness of the silicon layer be $2 \times 10^{-8}$ m or more.

In the semiconductor laser element according to the first aspect of the present disclosure including the preferred configurations described above, a configuration in which the first portion of the second electrode is covered by the first lead-out wiring layer formed on the insulating film, and the second portion of the second electrode and the protection electrode are covered by the second lead-out wiring layer formed on the insulating film is possible. In this case, a configuration in which the first lead-out wiring layer and the second lead-out wiring layer are formed, being spaced from each other, to extend from on the ridge stripe structure to on the side structure body is possible. In this configuration, a configuration in which the wire bonding layer extending from the second lead-out wiring layer is provided on the insulating film formed on one side structure body is possible, and also a configuration in which the surge protection electrode covered by the wire bonding layer is formed on a portion of one side structure body located between a portion of the wire bonding layer where wire bonding is made and the second lead-out wiring layer is possible. In such a configuration, a configuration in which a portion of the wire bonding layer where wire bonding is made is surrounded by a ring-shaped surge protection electrode is included. Here, one surge protection electrode may be provided, or a plurality of surge protection electrodes may be provided; and the surge protection electrode is preferably provided as near as possible to the portion of the wire bonding layer where wire bonding is made. This applies also to the semiconductor laser element according to the second aspect of the present disclosure. The protection electrode is preferably formed on both of the side stricture bodies provided on both sides of the ridge stripe structure; and a configuration in which the protection electrode is provided up to near the shoulder of the side structure body, alternatively up to the shoulder of the side structure body, or alternatively over the shoulder of the side structure body up to the side surface of the side structure body is possible. In the case where the protection electrode is formed up to near the shoulder of the side structure body, it is preferable that the distance (L) from an edge of the protection electrode facing the second portion of the second electrode to the shoulder of the side structure body facing the ridge stripe structure be 2 µm or less. The width of the protection electrode may be 1 µm or more, preferably 1.0 µm or more, from the viewpoint of stable formation. The length of the protection electrode is preferably the same as the length of the saturable absorption region, or is preferably the same as the length of the second portion of the second electrode.

In the semiconductor laser element according to the first aspect of the present disclosure including the preferred forms and configurations described above, or in the semiconductor laser element according to the second aspect of the present disclosure including the preferred configurations described above, a configuration in which a light reflecting end surface and a light emitting end surface are provided and the second portion of the second electrode is provided near the light reflecting end surface is possible. However, the configuration is not limited to such a configuration.

In the semiconductor laser element according to the first aspect or the second aspect of the present disclosure including the preferred forms and configurations described above, a configuration in which the stacked structure body is made of a GaN-based compound semiconductor is possible. Specifically, a configuration in which the stacked structure body is made of an AlGaInN-based compound semiconductor is possible. Here, as the AlGaInN-based compound semiconductor, more specifically, GaN, AlGaN, GaInN, and AlGaInN may be given. A boron (B) atom, a thallium (Tl) atom, an arsenic (As) atom, a phosphorus (P) atom, or an antimony (Sb) atom may be contained in these compound semiconductors, as desired. The third compound semiconductor layer (active layer), which forms the light emitting region (gain region) and the saturable absorption region, preferably has a quantum well structure. Specifically, the third compound semiconductor layer may have a single quantum well structure (SQW structure), or may have a multi quantum well structure (MQW structure). The third compound semiconductor layer (active layer) having a quantum well structure has a structure in which at least one well layer and one barrier layer are stacked; and as the combination of (compound semiconductor that forms the well layer, compound semiconductor that forms the barrier layer), $(In_yGa_{(1-y)}N, GaN)$, $(In_yGa_{(1-y)}N, In_zGa_{(1-z)}N)$ [provided that y>z], and $(In_yGa_{(1-y)}N, AlGaN)$ may be illustrated.

Alternatively, in the semiconductor laser element according to the first aspect or the second aspect of the present disclosure including the preferred forms and configurations described above, a configuration in which the stacked structure body is made of a GaAs-based compound semiconductor is possible, or a configuration in which the stacked structure body is made of a group IV-VI compound semiconductor, specifically such as a ZnSe-based compound semiconductor, is possible.

The semiconductor laser element according to the first aspect or the second aspect of the present invention including the preferred forms and configurations described above (hereinafter, they may be collectively referred to as simply "a semiconductor laser element etc. of the present disclosure") may be configured as a semiconductor laser element having a separate confinement heterostructure (SCH structure) having what is called a double-ridge structure, or may be configured as a semiconductor laser element having a separate confinement heterostructure having a double-ridge structure of an oblique ridge stripe. In the semiconductor laser element etc. of the present disclosure, a direct current is sent from the first portion of the second electrode to the first electrode via the light emitting region to create a forward bias state, and a voltage is applied between the first electrode and the second portion of the second electrode to apply an electric field to the saturable absorption region; thus, self-pulsation operation and mode-locking operation can be performed.

In the semiconductor laser element etc. of the present disclosure, a configuration in which the first portion and the second portion of the second electrode are separated by an isolation trench is possible. Here, the electric resistance value between the first portion and the second portion of the second electrode may be 1×10 times or more, preferably $1×10^2$ times or more, and more preferably $1×10^3$ times or more the electric resistance value between the second electrode and the first electrode. Alternatively, the electric resistance value between the first portion and the second portion of the second electrode may be $1×10^2 \Omega$ or more, preferably $1×10^3 \Omega$ or more, and more preferably $1×10^4 \Omega$ or more.

By thus setting the electric resistance value between the first portion and the second portion of the second electrode to 1×10 times or more the electric resistance value between the second electrode and the first electrode or to $1×10^2 \Omega$ or more, the flow of leakage current from the first portion to the second portion of the second electrode can be reliably suppressed. That is, the reverse bias voltage $V_{sa}$ applied to the saturable absorption region (carrier non-injection region) can be optimized, and therefore mode-locking operation of a single mode having a light pulse with a short time width can be obtained, for example. Such a high electric resistance value between the first portion and the second portion of the second electrode can be achieved by simply separating the second electrode into the first portion and the second portion by means of the isolation trench.

Alternatively, in the semiconductor laser element etc. of the present disclosure, the width of the isolation trench that separates the second electrode into the first portion and the second portion may be not less than 2 µm and not more than 40% of the resonator length in the semiconductor laser element (hereinafter, referred to as simply a "resonator length"), preferably not less than 10 µm and not more than 20% of the resonator length. As the resonator length, 0.6 mm may be illustrated, but the resonator length is not limited to this.

In the semiconductor laser element etc. of the present disclosure, a configuration in which the second electrode, the protection electrode, and the surge protection electrode are formed of a palladium (Pd) single layer, a nickel (Ni) single layer, a platinum (Pt) single layer, a palladium layer/platinum layer stacked structure in which a palladium layer is in contact with the second compound semiconductor layer, or a palladium layer/nickel layer stacked structure in which a palladium layer is in contact with the second compound semiconductor layer is possible. In the case where the lower metal layer is formed of palladium and the upper metal layer is formed of nickel, the thickness of the upper metal layer may be 0.1 μm or more, preferably 0.2 μm or more. Alternatively, a configuration in which the second electrode is made of a palladium (Pd) single layer is preferable, and in this case the thickness may be 20 nm or more, preferably 50 nm or more. Alternatively, a configuration in which the second electrode is made of a palladium (Pd) single layer, a nickel (Ni) single layer, a platinum (Pt) single layer, or a stacked structure of a lower metal layer and an upper metal layer in which the lower metal layer is in contact with the second compound semiconductor layer (provided that the lower metal layer is formed of one metal selected from the group consisting of palladium, nickel, and platinum) is preferable.

When the first conductivity type is the n-type, the first electrode electrically connected to the first compound semiconductor layer having the n-conductivity type preferably has a single-layer configuration or a multiple-layer configuration containing at least one metal selected from the group consisting of gold (Au), silver (Ag), palladium (Pd), aluminum (Al), titanium (Ti), tungsten (W), copper (Cu), zinc (Zn), tin (Sn), and indium (In); for example, Ti/Au, Ti/Al, and Ti/Pt/Au may be illustrated. The first electrode is electrically connected to the first compound semiconductor layer, and the connection form includes a configuration in which the first electrode is formed on the first compound semiconductor layer and a configuration in which the first electrode is connected to the first compound semiconductor layer via an electrically conductive material layer or an electrically conductive substrate. The first electrode and the second electrode, the protection electrode, and the surge protection electrode can be formed into a film by, for example, various PVD methods such as the vacuum deposition method and the sputtering method. A pad electrode may be provided on the first electrode in order to electrically connect the first electrode to an external electrode or circuit.

The first lead-out wiring layer, the second lead-out wiring layer, the wire bonding layer, and the pad electrode preferably have a single-layer configuration or a multiple-layer configuration containing at least one metal selected from the group consisting of titanium (Ti), aluminum (Al), platinum (Pt), gold (Au), and nickel (Ni). Alternatively, a multiple-layer configuration such as a multiple-layer configuration of Ti/Pt/Au or a multiple-layer configuration of Ti/Au is possible.

In the semiconductor laser element etc. of the present disclosure, a configuration in which, not limitedly, the third compound semiconductor layer has a quantum well structure including a well layer and a barrier layer, the thickness of the well layer is not less than 1 nm and not more than 10 nm, preferably not less than 1 nm and not more than 8 nm, and the impurity doping concentration of the barrier layer is not less than $2\times10^{18}$ cm$^{-3}$ and not more than $1\times10^{20}$ cm$^{-3}$, preferably not less than $1\times10^{19}$ cm$^{-3}$ and not more than $1\times10^{20}$ cm$^{-3}$, is possible.

By thus setting the thickness of the well layer included in the third compound semiconductor layer to not less than 1 nm and not more than 10 nm and the impurity doping concentration of the barrier layer included in the third compound semiconductor layer to not less than $2\times10^{18}$ cm$^{-3}$ and not more than $1\times10^{20}$ cm$^{-3}$, that is, by thinning the thickness of the well layer and yet attempting to increase the amount of carriers of the third compound semiconductor layer, the effect of piezoelectric polarization can be reduced, and a laser light source that can produce a single-peaked light pulse with a short time width and a limited amount of subpulse components can be obtained. Furthermore, mode-locking driving can be achieved with a low reverse bias voltage, and a light pulse train synchronized with an external signal (electric signal and optical signal) can be produced. A configuration in which the impurity doped in the barrier layer is silicon (Si) is possible, but the impurity is not limited to this and also oxygen (O) may be used.

In the semiconductor laser element etc. of the present disclosure, a structure in which the second compound semiconductor layer has a superlattice structure in which a p-type GaN layer and a p-type AlGaN layer are alternately stacked and the thickness of the superlattice structure is 0.7 μm or less is possible. By employing such a structure of a superlattice structure, the amount of series resistance components of the semiconductor laser element can be reduced while a high refractive index necessary as a cladding layer is maintained, and consequently the operating voltage of the semiconductor laser element can be reduced. As the lower limit of the thickness of the superlattice structure, not limitedly, 0.3 μm may be given, for example; and 1 nm to 5 nm may be illustrated as the thickness of the p-type GaN layer included in the superlattice structure, 1 nm to 5 nm may be illustrated as the thickness of the p-type AlGaN layer included in the superlattice structure, and 60 to 300 may be illustrated as the total number of layers of the p-type GaN layer and the p-type AlGaN layer. A configuration in which the distance from the third compound semiconductor layer to the second electrode is 1 μm or less, preferably 0.6 μm or less, is possible. By thus setting the distance from the third compound semiconductor layer to the second electrode, the thickness of the p-type second compound semiconductor layer with high resistance can be thinned, and a reduction in the operating voltage of the semiconductor laser element can be achieved. As the lower limit of the distance from the third compound semiconductor layer to the second electrode, not limitedly, 0.3 μm may be given, for example. A configuration in which the second compound semiconductor layer is doped with Mg at $1\times10^{19}$ cm$^{-3}$ or more and the absorption coefficient of the second compound semiconductor layer for light of a wavelength of 405 nm from the third compound semiconductor layer is at least 50 cm$^{-1}$ is possible. This atomic concentration of Mg is derived from the material property of exhibiting the maximum hole concentration at the value of $2\times10^{19}$ cm$^{-3}$, and is a result of being designed so that the hole concentration is maximized, that is, the resistivity of the second compound semiconductor layer is minimized. The absorption coefficient of the second compound semiconductor layer is set from the viewpoint of reducing the resistance of the semiconductor laser element as low as possible, and consequently the absorption coefficient of light of the third compound semiconductor layer is generally 50 cm$^{-1}$. However, the amount of doped Mg may be intentionally set to a concentration of $2\times10^{19}$ cm$^{-3}$ or more in order to increase the absorption coefficient. In this case, the upper limit of the amount of doped Mg in terms of a practical hole concentration being obtained is, for example, $8\times10^{19}$ cm$^{-3}$. A configuration in which the second compound semiconductor layer includes a non-doped compound semiconductor layer and a p-type compound semiconductor layer from the third compound semiconductor layer side, and the distance from the third compound semiconductor layer to the p-type compound semiconductor layer is $1.2\times10^{-7}$ m or less is possible. By thus setting the distance from the third compound semiconductor layer to the p-type compound semiconductor layer, the internal loss can be suppressed within the range in which the internal quantum efficiency is not reduced; thereby, the threshold current density at which laser oscillation is started can be reduced. As the lower limit of the distance from the third compound semiconductor layer to the p-type compound semiconductor layer, not limitedly, $5 \times 10^{-8}$ m may be given, for example. A configuration in which a stacked insulating film formed of a SiOx/Si stacked structure is formed on the ridge stripe structure and the side structure body, and the difference between the effective refractive index of the ridge stripe structure and the effective refractive index of the stacked insulating film is $5 \times 10^{-3}$ to $1 \times 10^{-2}$ is possible. By using such a stacked insulating film, a single fundamental transverse mode can be maintained even in a high-power operation of more than 100 milliwatts. The second compound semiconductor layer may be a structure in which a non-doped GaInN layer (p-side light guide layer), a non-doped AlGaN layer (p-side cladding layer), a Mg-doped AlGaN layer (electron barrier layer), a GaN layer (Mg-doped)/AlGaN layer superlattice structure (superlattice cladding layer), and a Mg-doped GaN layer (p-side contact layer) are stacked from the third compound semiconductor layer side, for example. The band gap of the compound semiconductor that forms the well layer in the third compound semiconductor layer is preferably 2.4 eV or more. The wavelength of the laser light emitted from the third compound semiconductor layer (active layer) may be 360 nm to 500 nm, preferably 400 nm to 410 nm. Here, it goes without saying that the various configurations described above may be combined as appropriate.

In the semiconductor laser element etc. of the present disclosure, various compound semiconductor layers (e.g. GaN-based compound semiconductor layers) that constitute the semiconductor laser element are sequentially formed on a substrate; here, as the substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, and a Si substrate, and a substrate in which an underlayer and/or a buffer layer is formed on a surface (major surface) of these substrates may be given as well as a sapphire substrate. In the case where mainly a GaN-based compound semiconductor layer is formed on the substrate, a GaN substrate is preferred because of the small density of defects; it is known that the properties of a GaN substrate change between polar, non-polar, and semi-polar, depending on the growth plane. As the method for forming various compound semiconductor layers that constitute the semiconductor laser element, the metal organic chemical vapor deposition method (MOCVD method or MOVPE method), the molecular beam epitaxy method (MBE method), the hydride vapor phase epitaxy method in which a halogen contributes to transport or reaction, etc. may be given.

Here, in the case where a GaN-based compound semiconductor layer is formed as the compound semiconductor layer, trimethylgallium (TMG) gas and triethylgallium (TEG) gas may be given as the organic gallium source gas in the MOCVD method, and ammonia gas and hydrazine gas may be given as the nitrogen source gas. In the formation of a GaN-based compound semiconductor layer having the n-conductivity type, silicon (Si), for example, may be added as the n-type impurity (n-type dopant); and in the formation of a GaN-based compound semiconductor layer having the p-conductivity type, magnesium (Mg), for example, may be added as the p-type impurity (p-type dopant). In the case where aluminum (Al) or indium (In) is contained as a constituent atom of the GaN-based compound semiconductor layer, trimethylaluminum (TMA) gas may be used as the Al source, and trimethylindium (TMI) gas may be used as the In source. Monosilane gas (SiH$_4$ gas) may be used as the Si source, and cyclopentadienylmagnesium gas, methylcyclopentadienylmagnesium, and bis(cyclopentadienyl)magnesium (Cp$_2$Mg) may be used as the Mg source. As the n-type impurity (n-type dopant), Ge, Se, Sn, C, Te, S, O, Pd, and Po may be given as well as Si; and as the p-type impurity (p-type dopant), Zn, Cd, Be, Ca, Ba, C, Hg, and Sr may be given as well as Mg.

The semiconductor laser element etc. of the present disclosure can be manufactured by, depending on the configuration and structure of the semiconductor laser element to be manufactured, the following method, for example. That is, it can be manufactured on the basis of a manufacturing method including the steps of (A) forming on a substrate a stacked structure body in which a first compound semiconductor layer having a first conductivity type and made of a compound semiconductor (specifically, a GaN-based compound semiconductor, for example), a third compound semiconductor layer that forms a light emitting region and a saturable absorption region made of a compound semiconductor (specifically, a GaN-based compound semiconductor, for example), and a second compound semiconductor layer having a second conductivity type different from the first conductivity type and made of a compound semiconductor (specifically, a GaN-based compound semiconductor, for example) are sequentially stacked, then (B) forming a ridge stripe structure and a side structure body in the stacked structure body, next (C) forming on the entire surface an insulating film in which openings are formed in portions where a second electrode, a protection electrode, and a surge protection electrode are to be formed, after that (D) forming the second electrode, the protection electrode, and the surge protection electrode on the basis of, for example, the lift-off method, and subsequently (E) forming a first lead-out wiring layer, a second lead-out wiring layer, and a wire bonding layer on the second electrode, the protection electrode, the surge protection electrode, and the insulating film.

Depending on the configuration and structure of the semiconductor laser element to be manufactured, in step (B), the second compound semiconductor layer may be etched partly in the thickness direction, alternatively the second compound semiconductor layer may be etched entirely in the thickness direction, alternatively the second compound semiconductor layer and the third compound semiconductor later may be etched in the thickness direction, or alternatively the second compound semiconductor layer, the third compound semiconductor layer, and the first compound semiconductor layer may be etched partly in the thickness direction.

In the semiconductor laser element etc. of the present disclosure, as described above, a configuration in which a reverse bias voltage is applied between the first electrode and the second portion of the second electrode (that is, a configuration in which the first electrode is used as the positive electrode and the second portion is used as the negative electrode) is preferable. To the second portion of the second electrode, a pulse current or a pulse voltage synchronized with the pulse current or the pulse voltage applied to the first portion of the second electrode may be applied, or a DC bias may be applied. A configuration in which a current is sent from the second electrode to the first electrode via the light emitting region and an external electric signal is superimposed from the second electrode to the first electrode via the light emitting region is possible. Thereby, synchronization between the laser light and the external electric signal can be made. Alternatively, a configuration in which an optical signal is caused to enter through one end surface of the stacked structure body is possible. Also by this, synchronization between the laser light and the optical signal can be made. In the second compound semiconductor layer, a non-doped compound semiconductor layer (e.g. a non-doped GaInN layer or a non-doped AlGaN layer) may be formed between the third compound semiconductor layer and the electron barrier layer. Furthermore, a non-doped GaInN layer as a light guide layer may be formed between the third compound semiconductor layer and the non-doped compound semiconductor layer. Also a structure in which a Mg-doped GaN layer (p-side contact layer) occupies the uppermost layer of the second compound semiconductor layer is possible.

In the semiconductor laser element etc. of the present disclosure, a configuration in which the length of the saturable absorption region is shorter than the length of the light emitting region is possible. Alternatively, a configuration in which the length of the second electrode (the total length of the first portion and the second portion) is shorter than the length of the third compound semiconductor layer (active layer) is possible. As the arrangement state of the first portion and the second portion of the second electrode, specifically, (1) a state in which one first portion of the second electrode and one second portion of the second electrode are provided, and the first portion of the second electrode and the second portion of the second electrode are placed across an isolation trench, (2) a state in which one first portion of the second electrode and two second portions of the second electrode are provided, and one end of the first portion faces one second portion across one isolation trench and the other end of the first portion faces the other second portion across another isolation trench, and (3) a state in which two first portions of the second electrode and one second portion of the second electrode are provided, and an end of the second portion faces one first portion across one isolation trench and the other end of the second portion faces the other first portion across another isolation trench (that is, the second electrode is a structure in which the second portion is sandwiched by the first portions) may be given. In a wide range, (4) a state in which N first portions of the second electrode and (N-1) second portions of the second electrode are provided, and first portions of the second electrode are placed to sandwich a second portion of the second electrode, and (5) a state in which N second portions of the second electrode and (N-1) first portions of the second electrode are provided, and second portions of the second electrode are placed to sandwich a first portion of the second electrode may be given. The states of (4) and (5) are, in other words, (4') a state in which N light emitting regions [carrier injection regions, gain regions] and (N-1) saturable absorption regions [carrier non-injection regions] are provided, and light emitting regions are placed to sandwich a saturable absorption region, and (5') a state in which N saturable absorption regions [carrier non-injection regions] and (N-1) light emitting regions [carrier injection regions, gain regions] are provided, and saturable absorption regions are placed to sandwich a light emitting region.

The semiconductor laser element etc. of the present disclosure can be used for, for example, fields such as optical disk systems, communication fields, optical information fields, optoelectronic integrated circuits, fields of application of nonlinear optical phenomena, optical switches, laser measurement fields, various analysis fields, ultrafast spectroscopy fields, multiphoton excitation spectroscopy fields, mass spectrometry fields, fields of microspectroscopy utilizing multiphoton absorption, quantum control of chemical reactions, nanoscale three-dimensional processing fields, various processing fields of application of multiphoton absorption, medical fields, and bioimaging fields.

EXAMPLE 1

Figure 2:
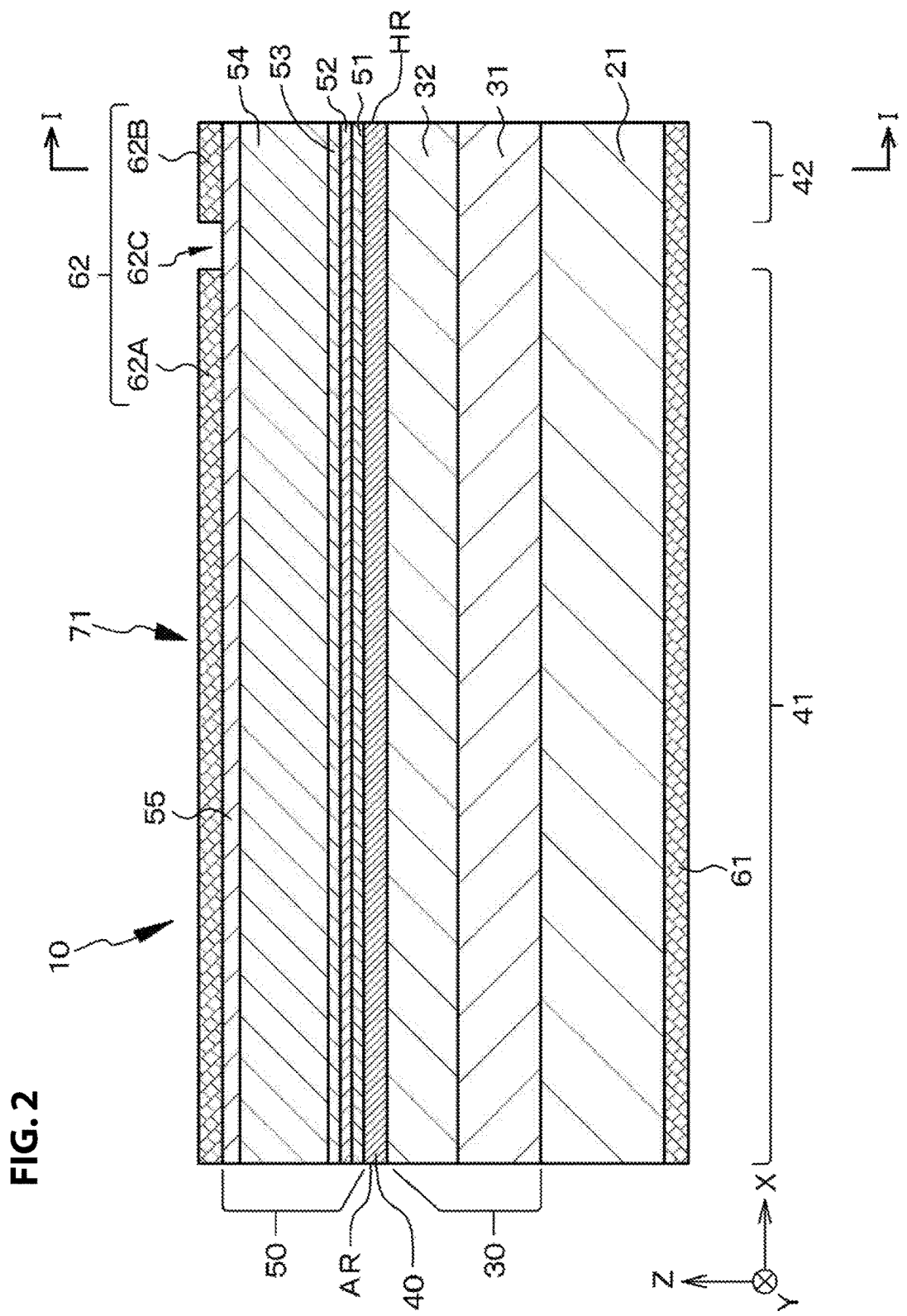
FIG. 2 is a schematic end view of the semiconductor laser element of Example 1 along the direction in which the resonator extends.
Figure 3:
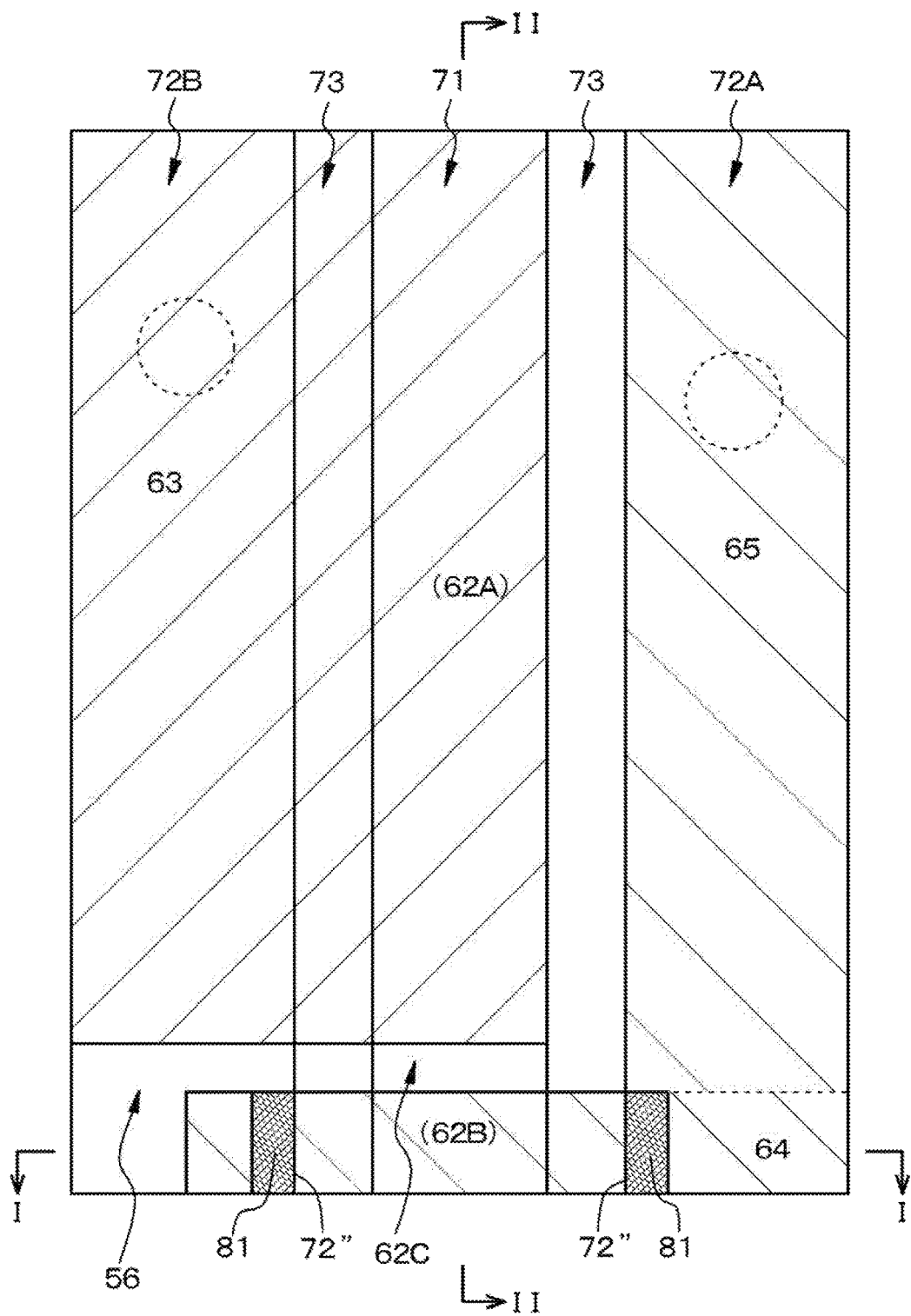
FIG. 3 is a schematic diagram of the semiconductor laser element of Example 1 as viewed from above.

Example 1 relates to the semiconductor laser element according to the first aspect of the present disclosure. A schematic cross-sectional view of a semiconductor laser element of Example 1 along the direction orthogonal to the direction in which the resonator extends (a schematic cross-sectional view taken along the YZ plane) is shown in FIG. 1, a schematic end view along the direction in which the resonator extends (a schematic end view taken along the XZ plane) is shown in FIG. 2, and a schematic diagram of the semiconductor laser element of Example 1 as viewed from above is shown in FIG. 3. FIG. 1 is a schematic end view along arrows I-I of FIG. 2 and FIG. 3, and FIG. 2 is a schematic cross-sectional view along arrows II-II of FIG. 1 and FIG. 3.

A semiconductor laser element 10 of Example 1 or Example 2 described later (hereinafter, these semiconductor laser elements may be collectively referred to as "a semiconductor laser element of Example 1 etc.") is formed of a bi-section type semiconductor laser element, and includes (a) a stacked structure body in which a first compound semiconductor layer 30 having a first conductivity type (in each Example, specifically the n-conductivity type) and made of a compound semiconductor (specifically, a GaN-based compound semiconductor), a third compound semiconductor layer (active layer) 40 that forms a light emitting region (gain region) 41 and a saturable absorption region 42 made of a compound semiconductor (specifically, a GaN-based compound semiconductor), and a second compound semiconductor layer 50 having a second conductivity type (in each Example, specifically the p-conductivity type) different from the first conductivity type and made of a compound semiconductor (specifically, a GaN-based compound semiconductor) are sequentially stacked, (b) a second electrode 62, and (c) a first electrode 61 electrically connected to the first compound semiconductor layer 30.

A ridge stripe structure 71 formed of at least part of the stacked structure body is formed, a side structure body 72 (72A and 72B) formed of the stacked structure body is formed on both sides of the ridge stripe structure 71, and the second electrode 62 formed on the second compound semiconductor layer 50 that forms the ridge stripe structure 71 is separated into a first portion 62A for sending a direct current to the first electrode 61 via the light emitting region 41 to create a forward bias state and a second portion 62B for applying an electric field to the saturable absorption region 42. Specifically, the first portion 62A and the second portion 62B are separated by an isolation trench 62C.

In FIG. 3, a first lead-out wiring layer 63, a second lead-out wiring layer 64, a wire bonding layer 65, and a protection electrode 81 described later are shaded in order to show them clearly, and the first portion 62A and the second portion 62B of the second electrode are shown as well. In the first lead-out wiring layer 63 and the wire bonding layer 65, a gold wire, for example, is wire-bonded to the area enclosed by the dotted circle.

As described above, the stacked structure body includes the ridge stripe structure 71. Specifically, the semiconductor laser element 10 of Example 1 etc. is a semiconductor laser element having a separate confinement heterostructure (SCH structure) having what is called a double-ridge structure. More specifically, the semiconductor laser element 10 is an index-guide type GaN-based semiconductor laser element made of AlGaInN, which has been developed for the Blu-ray optical disk system. The first compound semiconductor layer 30, the third compound semiconductor layer 40, and the second compound semiconductor layer 50 are specifically made of an AlGaInN-based compound semiconductor, and more specifically have the layer configuration shown in Table 1 below in the semiconductor laser element 10 of Example 1 etc. Here, in Table 1, a compound semiconductor layer written in a lower position is a layer nearer to an n-type GaN substrate 21. The band gap of the compound semiconductor that forms the well layer in the third compound semiconductor layer 40 is 3.06 eV. The semiconductor laser element 10 in Example 1 etc. is provided on the (0001) plane of the n-type GaN substrate 21, and the third compound semiconductor layer 40 has a quantum well structure. The (0001) plane of the n-type GaN substrate 21 is also called the "c-plane," and is a crystal plane having polarity. Parts of a p-type GaN contact layer 55 and a p-type GaN/AlGaN superlattice cladding layer 54 have been removed by the RIE method, and the ridge stripe structure 71, a recess 73, and the side structure body 72 are formed. A direct current is sent from the first portion 62A of the second electrode 62 to the first electrode 61 via the light emitting region 41 to create a forward bias state, and a voltage is applied between the first electrode 61 and the second portion 62B of the second electrode 62 to apply an electric field to the saturable absorption region 42; thus, self-pulsation operation and mode-locking operation can be performed. The width of the ridge stripe structure 71, the width of the recess 73, and the width and length of the protection electrode 81 are shown in Table 2 below.

TABLE 1

Second compound semiconductor layer 50
    p-type GaN contact layer (Mg-doped) 55
    p-type GaN (Mg-doped)/AlGaN superlattice cladding layer 54
    p-type AlGaN electron barrier layer (Mg-doped) 53
    Non-doped AlGaN cladding layer 52
    Non-doped GaInN light guide layer 51
Third compound semiconductor layer 40
    GaInN quantum well active layer
        (well layer: $Ga_{0.92}In_{0.08}N$/barrier layer: $Ga_{0.98}In_{0.02}N$)
First compound semiconductor layer 30
    n-type GaN cladding layer 32
    n-type AlGaN cladding layer 31

TABLE 2

Width of the ridge stripe structure 71: 1.5 μm
Width of the recess 73: 7.0 μm
Width of the protection electrode 81: 5.0 μm
Length of the protection electrode 81: 30 μm The protection electrode 81 is formed on a portion 72' adjacent to (facing) the second portion 62B of the second electrode 62 of at least one side structure body 72 (in Example 1, both of the side structure bodies 72A and 72B), and an oxide insulating material, specifically an insulating film 56 made of $SiO_x$, is formed to extend from on a portion of the ridge stripe structure 71 to on a portion of the side structure body 72, on which portions neither the second electrode 62 nor the protection electrode 81 is formed. A silicon layer made of amorphous silicon (not shown) is formed on the insulating film 56. Here, the difference between the effective refractive index of the ridge stripe structure 71 and the effective refractive index of the insulating film 56 and the silicon layer as a whole is $5 \times 10^{-3}$ to $1 \times 10^{-2}$, specifically $7 \times 10^{-3}$. The second electrode (p-side ohmic electrode) 62 and the protection electrode 81 made of Pd with a thickness of 0.1 μm are formed on the p-type GaN contact layer 55 corresponding to the top surfaces of the ridge stripe structure 71 and the side structure body 72. On the other hand, the first electrode (n-side ohmic electrode) 61 made of Ti/Pt/Au is formed on the back surface of the n-type GaN substrate 21.

In the semiconductor laser element 10 of Example 1 etc., the p-type AlGaN electron barrier layer 53, the p-type GaN/AlGaN superlattice cladding layer 54, and the p-type GaN contact layer 55, which are Mg-doped compound semiconductor layers, are located so as to overlap as little as possible with the light density distribution generated from the third compound semiconductor layer 40 and its vicinity; thereby, the internal loss is suppressed within the range in which the internal quantum efficiency is not reduced. Thus, the threshold current density at which laser oscillation is started is reduced. Specifically, the distance from the third compound semiconductor layer 40 to the p-type AlGaN electron barrier layer 53 is set to 0.10 μm, the height of the ridge stripe structure 71 to 0.30 μm, the thickness of the second compound semiconductor layer 50 located between the second electrode 62 and the third compound semiconductor layer 40 to 0.50 μm, and the thickness of a portion of the p-type GaN/AlGaN superlattice cladding layer 54 located under the second electrode 62 to 0.40 μm.

In the semiconductor laser element 10 in Example 1 etc., as described above, the second electrode 62 is separated by the isolation trench 62C into the first portion 62A for sending a direct current to the first electrode 61 via the light emitting region (gain region) 41 to create a forward bias state and the second portion 62B for applying an electric field to the saturable absorption region 42 (the second portion 62B for applying a reverse bias voltage $V_{sa}$ to the saturable absorption region 42). Here, the electric resistance value between the first portion 62A and the second portion 62B of the second electrode 62 (occasionally referred to as an "isolation resistance value") is $1 \times 10$ times or more, specifically $1.5 \times 10^3$ times, the electric resistance value between the second electrode 62 and the first electrode 61. The electric resistance value between the first portion 62A and the second portion 62B of the second electrode 62 (isolation resistance value) is $1 \times 10^2 \Omega$ or more, specifically $1.5 \times 10^4 \Omega$.

In the semiconductor laser element 10 in Example 1 etc., laser light is emitted from an end surface of the stacked structure body on the light emitting region side (light emitting end surface). On the light emitting end surface, an anti-reflection coating layer (AR) or a low-reflection coating layer with a reflectance of 0.5% or less, preferably a reflectance of 0.3% or less, is formed, for example. On the other hand, on a light reflecting end surface of the semiconductor laser element 10, which surface faces the light emitting end surface, a high-reflection coating layer (HR) with a reflectance of 85% or more, preferably 95% or more, is formed. The illustration of the anti-reflection coating layer (AR), the low-reflection coating layer, and the high-reflection coating layer (HR) is omitted. The saturable absorption region 42 is provided on the light reflecting end surface side facing the light emitting end surface of the semiconductor laser element 10. The length of the protection electrode 81 and the length of the second portion 62B of the second electrode are the same as the length of the saturable absorption region 42. As the anti-reflection coating layer or the low-reflection coating layer, a stacked structure of at least two layers selected from the group consisting of a titanium oxide layer, a tantalum oxide layer, a zirconia oxide layer, a silicon oxide layer, and an aluminum oxide layer may be given. The second portion 62B of the second electrode 62 is provided near the light reflecting end surface.

As described above, it is preferable to form the second electrode 62 having an isolation resistance value of $1\times10^2 \Omega$ or more on the second compound semiconductor layer 50. In the case of a GaN-based semiconductor laser element, the mobility in the compound semiconductor having the p-conductivity type is small, unlike in conventional GaAs-based semiconductor laser elements; thus, without increasing the resistance of the second compound semiconductor layer 50 having the p-conductivity type by ion implantation etc., the electric resistance value between the first portion 62A and the second portion 62B of the second electrode 62 can be made 10 times or more the electric resistance value between the second electrode 62 and the first electrode 61, or the electric resistance value between the first portion 62A and the second portion 62B of the second electrode 62 can be made $1\times10^2 \Omega$ or more, by separating the second electrode 62 formed on the second compound semiconductor layer 50 by means of the isolation trench 62C.

The first portion 62A of the second electrode 62 is covered by the first lead-out wiring layer 63 formed on the insulating film 56, and the second portion 62B of the second electrode 62 and the protection electrode 81 are covered by the second lead-out wiring layer 64 formed on the insulating film 56. Here, the first lead-out wiring layer 63 and the second lead-out wiring layer 64 are formed, being spaced from each other, to extend from on the ridge stripe structure 71 to on the side structure body 72. The wire bonding layer 65 extending from the second lead-out wiring layer 64 is provided on the insulating film 56 formed on the side structure body 72. More specifically, the first portion 62A of the second electrode 62 is covered by the first lead-out wiring layer 63 provided on the insulating film 56 that is formed to extend from on the portion of the ridge stripe structure 71 to on the portion of the side structure body 72. The second portion 62B of the second electrode 62 is covered by the second lead-out wiring layer 64 provided on the insulating film 56 that is formed to extend from the other side structure body 72B, over the ridge stripe structure 71, to the one side structure body 72A. The wire bonding layer 65 extending from the second lead-out wiring layer 64 is provided on the insulating film 56 formed on the one side structure body 72A.

Figure 4:
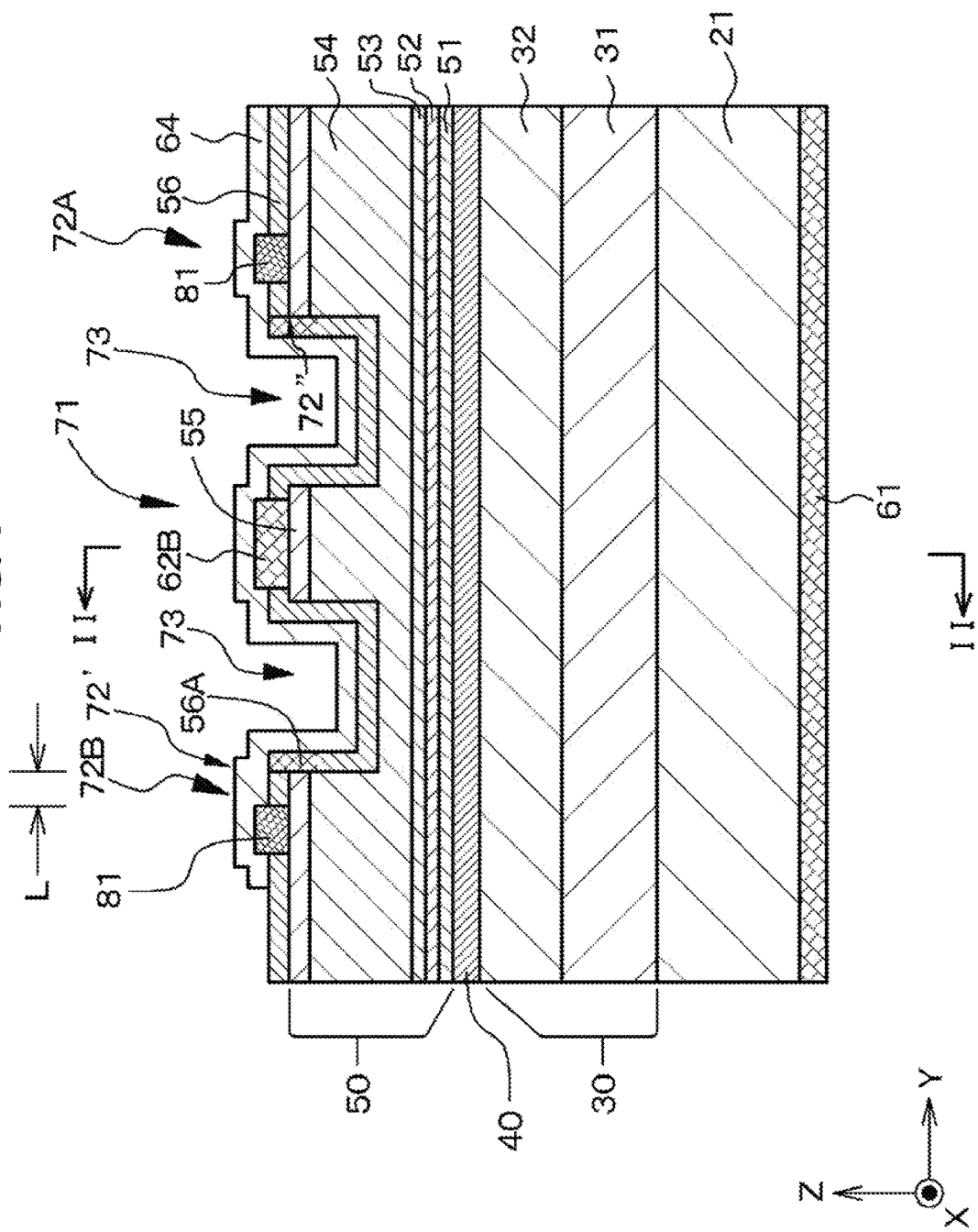
FIG. 4 is a schematic cross-sectional view of a modification example of the semiconductor laser element of Example 1 along the direction orthogonal to the direction in which the resonator extends.
Figure 5:
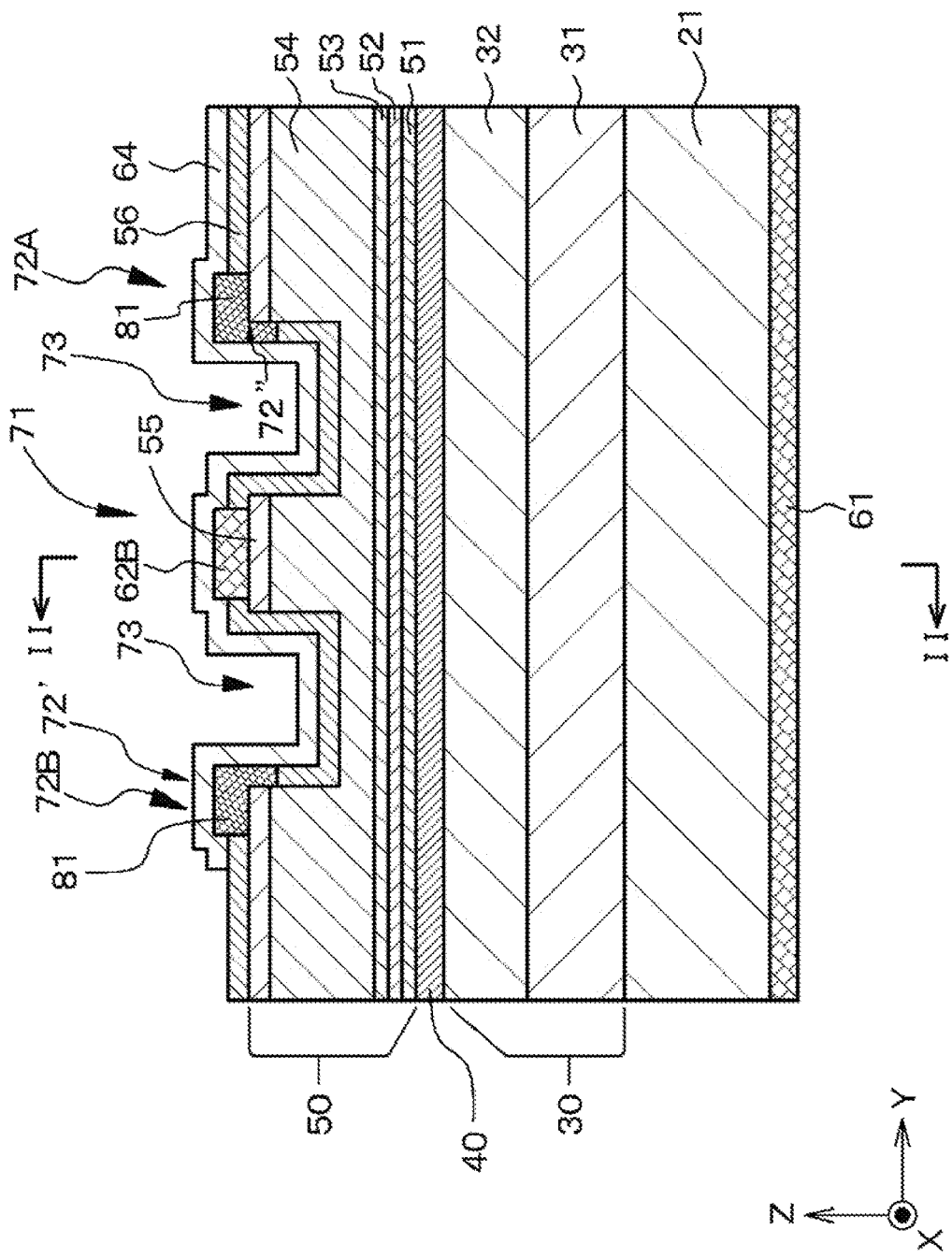
FIG. 5 is a schematic cross-sectional view of another modification example of the semiconductor laser element of Example 1 along the direction orthogonal to the direction in which the resonator extends.
Figure 6:
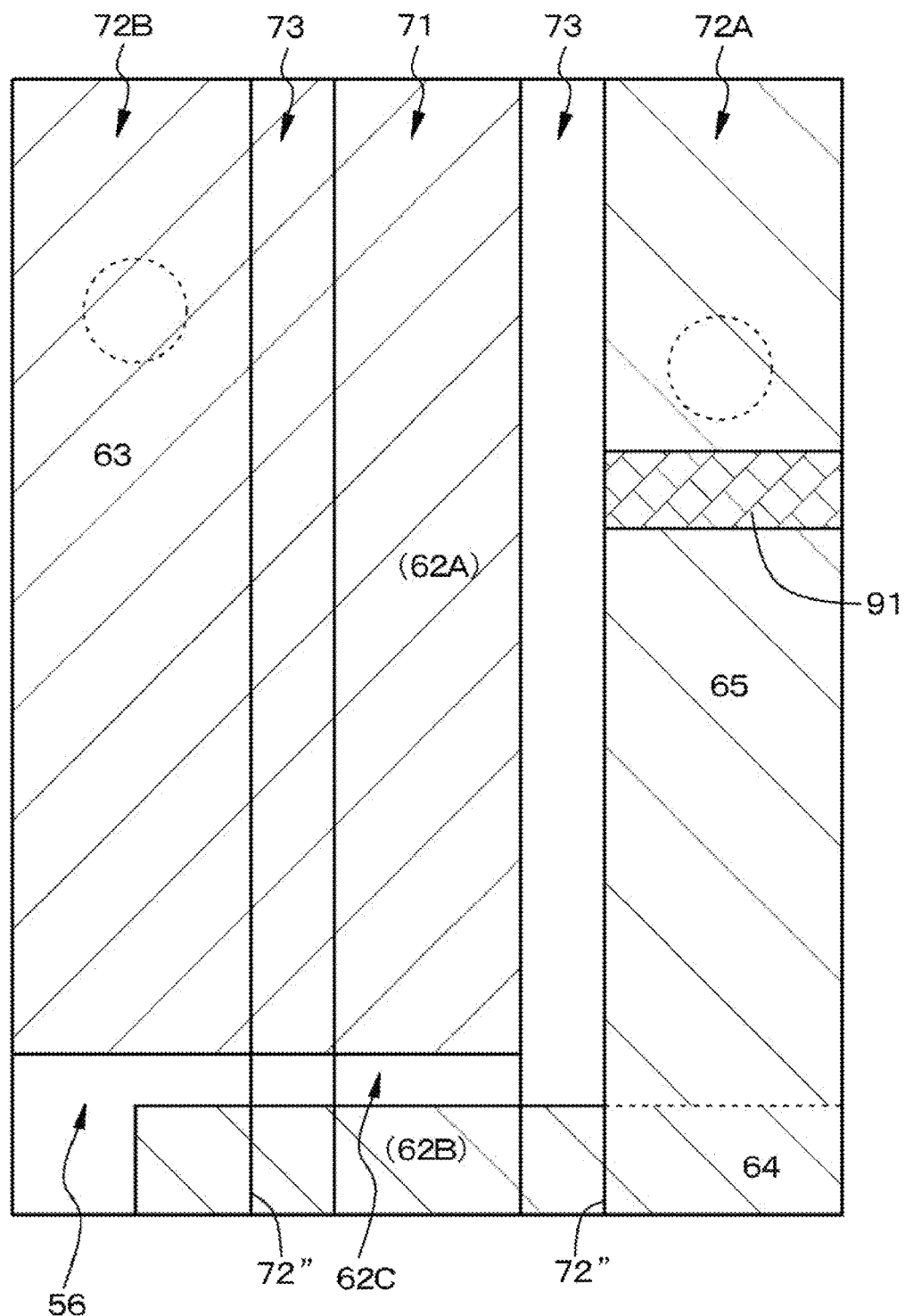
FIG. 6 is a schematic diagram of a semiconductor laser element of Example 2 as viewed from above.
Figure 7:
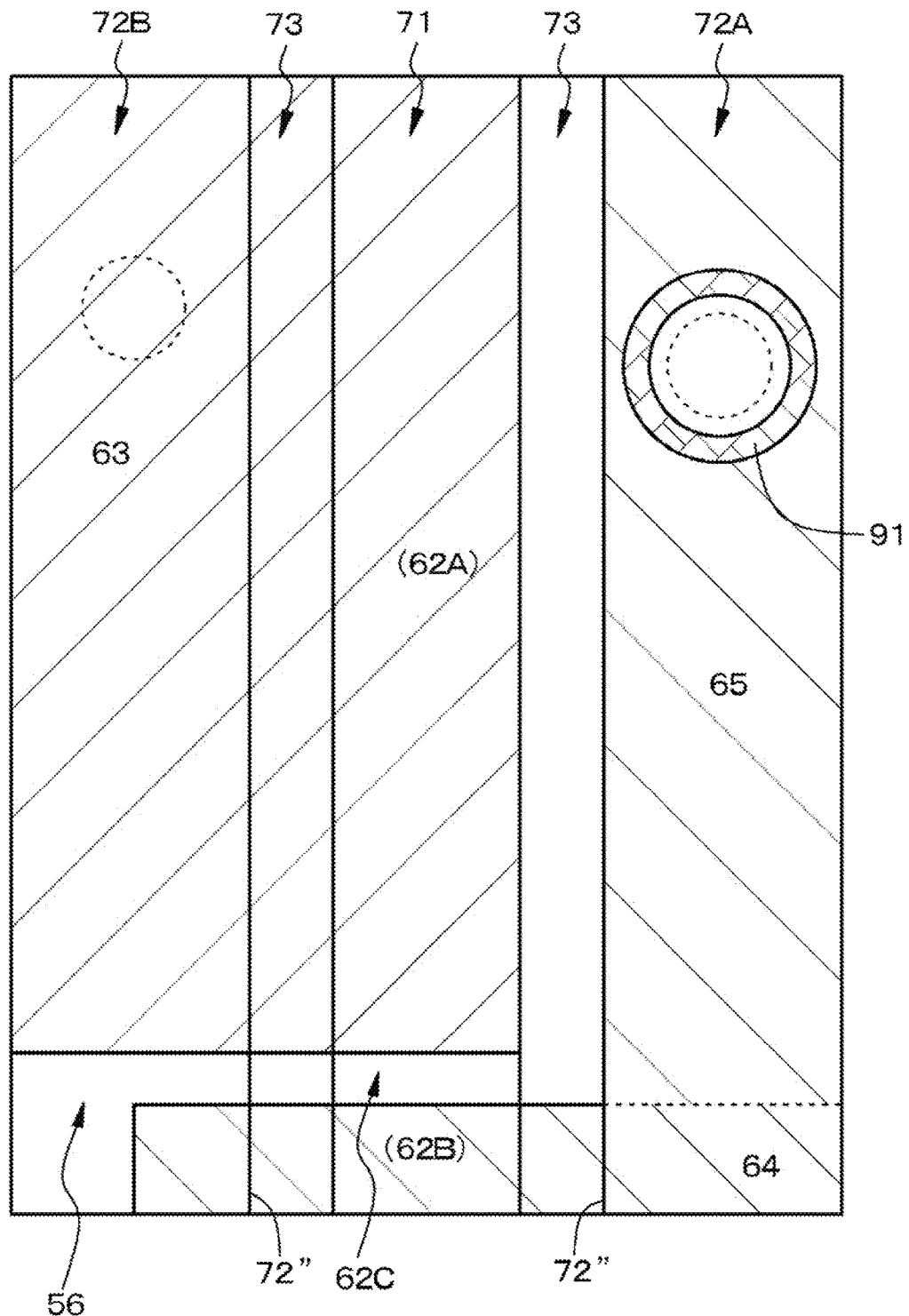
FIG. 7 is a schematic diagram of a modification example of the semiconductor laser element of Example 2 as viewed from above.

The protection electrodes 81 are made to face both of the side structure bodies 72A and 72B formed on both sides of the ridge stripe structure 71, and are provided up to the shoulder 72" of the side structure body 72. However, the configuration is not to limited to this; the protection electrode 81 may be provided up to near the shoulder 72" of the side structure body 72 as shown in FIG. 4, or the protection electrode 81 may be provided over the shoulder 72" of the side structure body 72 up to the side surface of the side structure bode 72 (the side wall of the recess 73) as shown in FIG. 5. It is preferable that the distance L shown in FIG. 4 (the distance L from an edge of the protection electrode 81 facing the second portion 62B of the second electrode to the shoulder 72" of the side structure body 72A or 72B be 2 μm or less.

The thickness of the p-type GaN/AlGaN superlattice cladding layer 54 having a superlattice structure in which a p-type GaN layer and a p-type AlGaN layer are alternately stacked is 0.7 μm or less, specifically 0.4 μm; the thickness of the p-type GaN layer included in the superlattice structure is 2.5 nm, and the thickness of the p-type AlGaN layer included in the superlattice structure is 2.5 nm; and the total number of p-type GaN layers and p-type AlGaN layers is 160. The distance from the third compound semiconductor layer 40 to the second electrode 62 is 1 μm or less, specifically 0.5 μm. The p-type AlGaN electron barrier layer 53, the p-type GaN/AlGaN superlattice cladding layer 54, and the p-type GaN contact layer 55 included in the second compound semiconductor layer 50 are doped with Mg at $1\times10^{19}$ cm$^{-3}$ or more (specifically, $2\times10^{19}$ cm$^{-3}$), and the absorption coefficient of the second compound semiconductor layer 50 for light of a wavelength of 405 nm is at least 50 cm$^{-1}$, specifically 65 cm$^{-1}$. The second compound semiconductor layer 50 includes a non-doped compound semiconductor layer (the non-doped GaInN light guide layer 51 and the non-doped AlGaN cladding layer 52) and a p-type compound semiconductor layer from the third compound semiconductor layer side, and the distance from the third compound semiconductor layer 40 to the p-type compound semiconductor layer (specifically, the p-type AlGaN electron barrier layer 53) is $1.2\times10^{-7}$ m or less, specifically 100 nm.

A method for manufacturing the semiconductor laser element 10 in Example 1 will now be described with reference to FIG. 16A, FIG. 16B, and FIG. 17. FIG. 16A, FIG. 16B, and FIG. 17 are schematic partial end views like along arrows I-I of FIG. 2 and FIG. 3.

[Step 100]

First, a stacked structure body in which the first compound semiconductor layer 30 having a first conductivity type (n-conductivity type) and made of a compound semiconductor (specifically, a GaN-based compound semiconductor, for example), the third compound semiconductor layer (active layer) 40 that forms the light emitting region (gain region) 41 and the saturable absorption region 42 made of a compound semiconductor (specifically, a GaN-based compound semiconductor, for example), and the second compound semiconductor layer 50 having a second conductivity type (p-conductivity type) different from the first conductivity type and made of a compound semiconductor (specifically, a GaN-based compound semiconductor, for example) are sequentially stacked is formed on a substrate, specifically, the (0001) plane of the n-type GaN substrate 21, on the basis of a known MOCVD method.

[Step 110]

After that, in the stacked structure body, the ridge stripe structure 71 is formed and at the same time the side structure bodies 72A and 72B are formed on both sides of the ridge stripe structure 71, based on a known method (see FIG. 16A).

[Step 120]

After that, the insulating film 56 is formed and further a not-shown silicon layer is formed on the entire surface on the basis of the CVD method. Then, a resist layer in which openings are formed in portions of the insulating film 56 and the silicon layer where the second electrode 62 and the protection electrode 81 are to be formed is provided on the basis of photolithography technology, and the etching of the silicon layer and the insulating film 56 is performed; thus, parts of the second compound semiconductor layer 50 are exposed (see FIG. 16B).

[Step 130]

Subsequently, the second electrode 62 and the protection electrode 81 are formed on the exposed second compound semiconductor layer 50 on the basis of what is called the lift-off method (see FIG. 17). After that, the isolation trench 62C is formed in the second electrode 62 on the basis of photolithography technology and etching technology; thus, the first portion 62A and the second portion 62B of the second electrode are separated.

[Step 140]

After that, based on a known method, the first lead-out wiring layer 63, the second lead-out wiring layer 64, and the wire bonding layer 65 made of titanium (Ti), platinum (Pt), nickel (Ni), or gold (Au) are formed, and the formation of the first electrode 61, the cleaving of the substrate, etc. are performed and packaging is performed; thus, the semiconductor laser element 10 can be fabricated.

In general, the resistance R (Ω) of a semiconductor layer is expressed as follows, using the resistivity value ρ (Ω·m) of the material that forms the semiconductor layer, the length $X_0$ (m) of the semiconductor layer, the cross-sectional area S (m$^2$) of the semiconductor layer, the carrier density n (unit: cm$^{-3}$), the amount of charge e (unit: C), and the mobility μ (unit: m$^2$/V·sec).

$$R = (\rho \cdot X_0)/S$$
$$= X_0/(n \cdot e \cdot \mu \cdot S)$$

Since the mobility of a p-type GaN-based semiconductor is two or more orders smaller than that of a p-type GaAs-based semiconductor, the electric resistance value of the p-type GaN-based semiconductor tends to be higher. Thus, from the above formula, it is found that the electric resistance value of a semiconductor laser element having a ridge stripe structure with a small cross-sectional area is a large value.

From the results of measurement by the four-terminal method of the electric resistance value between the second portion 62A and the second portion 62B of the second electrode 62 of the fabricated semiconductor laser element 10, the electric resistance value between the first portion 62A and the second portion 62B of the second electrode 62 was 15 kΩ when the width of the isolation trench 62C was 20 μm. In the fabricated semiconductor laser element 10, a direct current was sent from the first portion 62A of the second electrode 62 to the first electrode 61 via the light emitting region 41 to create a forward bias state, and a reverse bias voltage $V_{sa}$ was applied between the first electrode 61 and the second portion 62B of the second electrode 62 to apply an electric field to the saturable absorption region 42; thus, self-pulsation operation was able to be performed. That is, the electric resistance value between the first portion 62A and the second portion 62B of the second electrode 62 is 10 times or more the electric resistance value between the second electrode 62 and the first electrode 61, or is 1×10$^2$Ω or more. Therefore, the flow of leakage current from the first portion 62A to the second portion 62B of the second electrode 62 was able to be reliably suppressed; consequently, the light emitting region 41 was able to be set to a forward bias state, and the saturable absorption region 42 was able to be reliably set to a reverse bias state; thus, single-mode self-pulsation operation was able to be reliably obtained. Specifically, the pulse width of the light pulse was 30 picoseconds, and the pulse peak power estimated from the time average power (65 milliwatts/sec, approximately 72 picojoules/pulse) was approximately 2.4 watts.

In the semiconductor laser element of Example 1, the protection electrode is formed on a portion adjacent to (facing) the second portion of the second electrode of at least one side structure body. The same value of voltage $V_{22}$ is applied to the second portion of the second electrode and the protection electrode, and the holes accumulated in the portion of the insulating film in the shoulder area of the side structure body are extracted to the protection electrode; consequently, the oxygen ions contained in the insulating film do not react with the compound semiconductor layer together with the accumulated holes. Therefore, anode oxidation reaction does not occur in the compound semiconductor layer directly under the insulating film, and the occurrence of a phenomenon in which the compound semiconductor forming the side structure body is oxidized to produce an oxide derived from the compound semiconductor and volume expansion occurs to cause disconnection in the second lead-out wiring layer formed above the compound semiconductor can be suppressed. Thus, a phenomenon in which a voltage cannot be applied to the saturable absorption region and mode-locking operation cannot be performed does not occur. A reverse bias is applied to the third compound semiconductor layer that forms the side structure body, like in the saturable absorption region; therefore, current injection into the third compound semiconductor layer that forms the side structure body is not made, and the functions of the light emitting region and the saturable absorption region are not impaired.

Figure 15A:
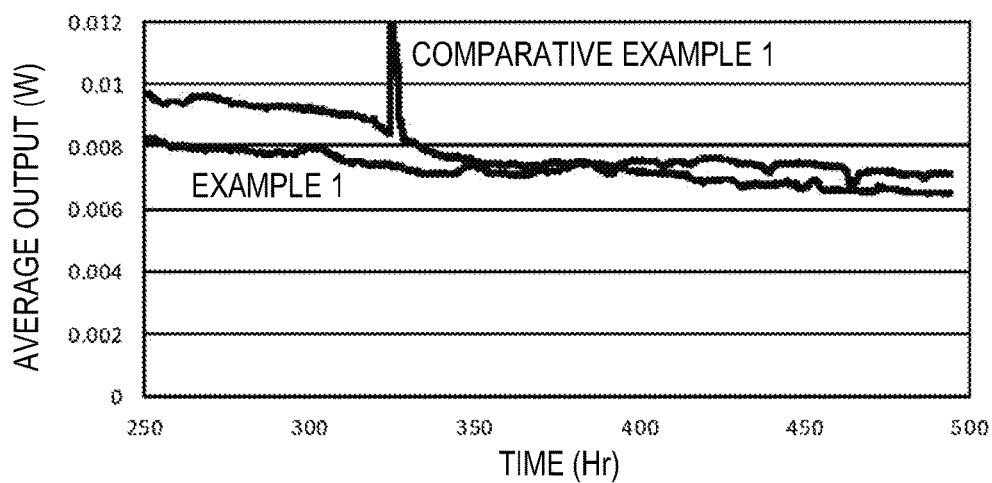
FIG. 15A and FIG. 15B are graphs showing the results of average output measurement and the results of photocurrent measurement, respectively, based on continuous operation tests of the semiconductor laser element of Example 1 and a semiconductor laser element of Comparative Example 1.
Figure 15B:
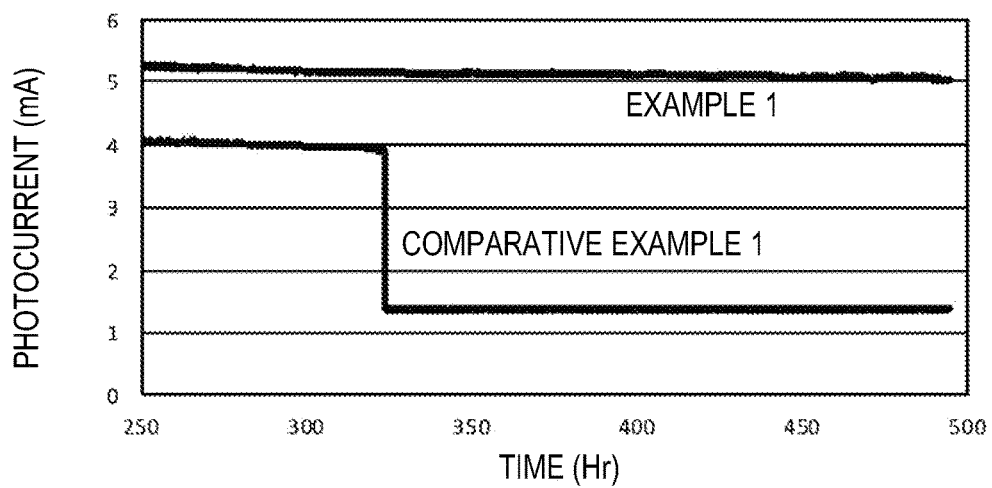
Figure 18:
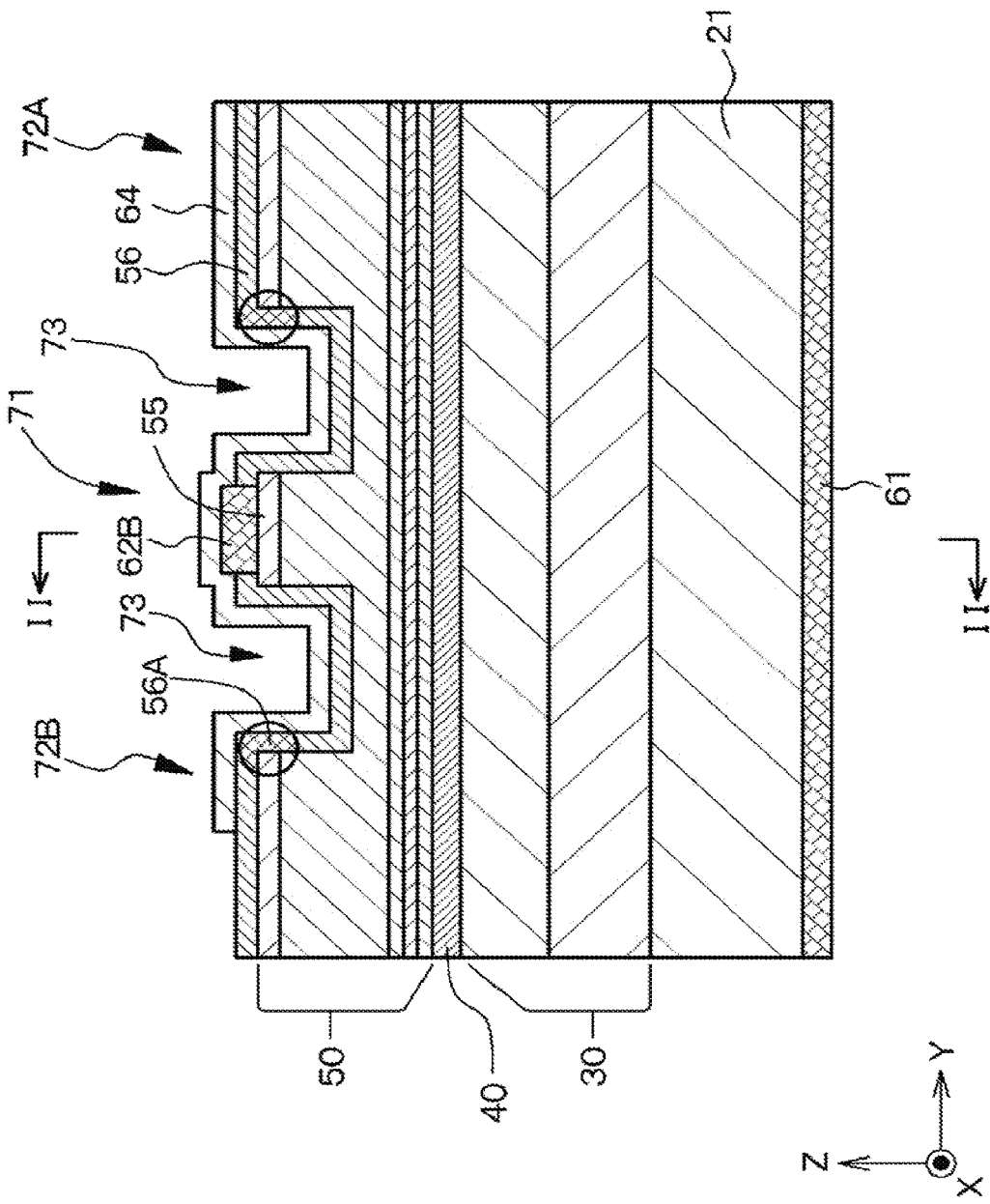
FIG. 18 is a schematic cross-sectional view of a conventional bi-section type semiconductor laser element along the direction orthogonal to the direction in which the resonator extends.
Figure 19:
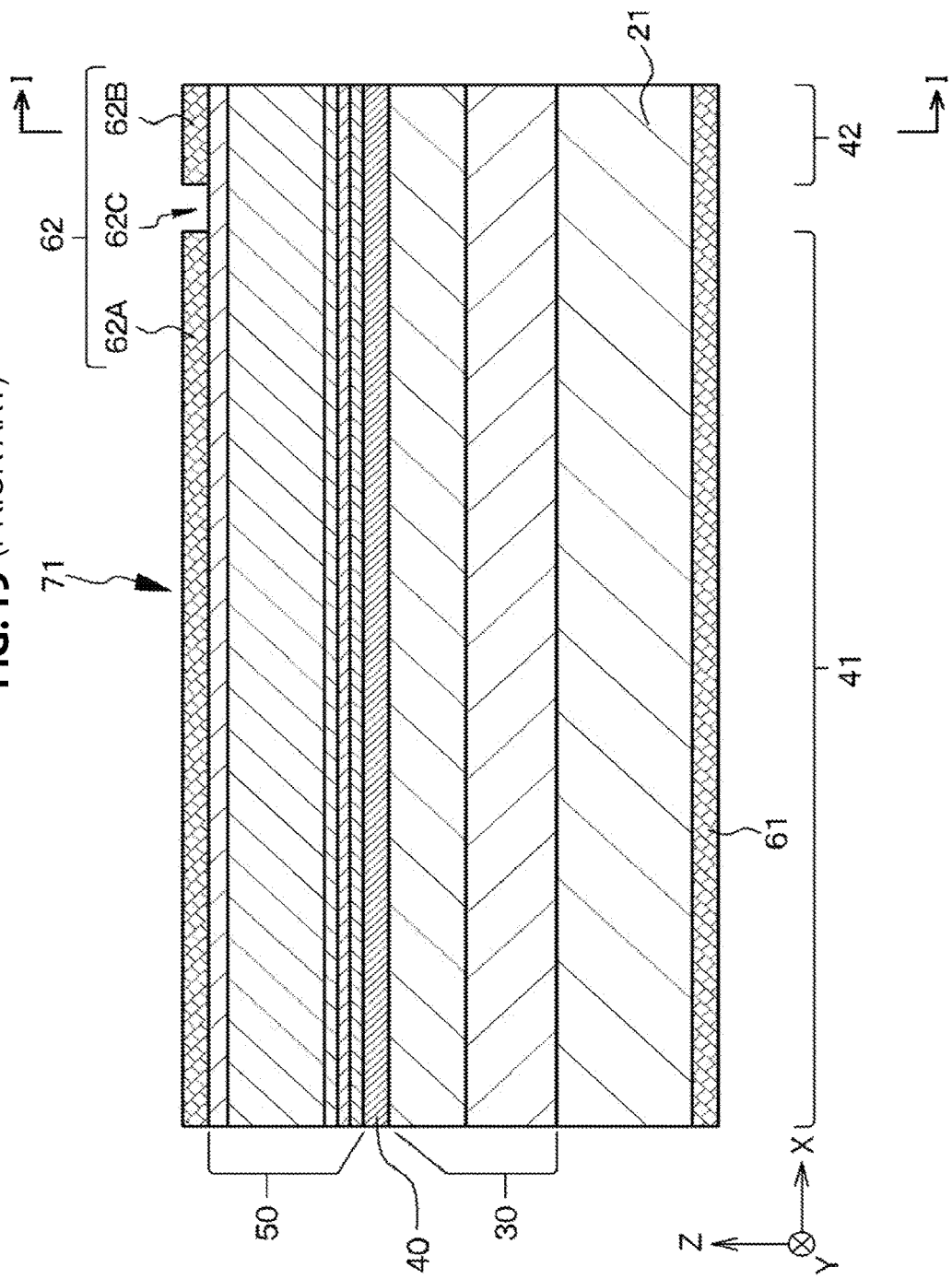
FIG. 19 is a schematic end view of the conventional bi-section type semiconductor laser element along the direction in which the resonator extends.
Figure 20:
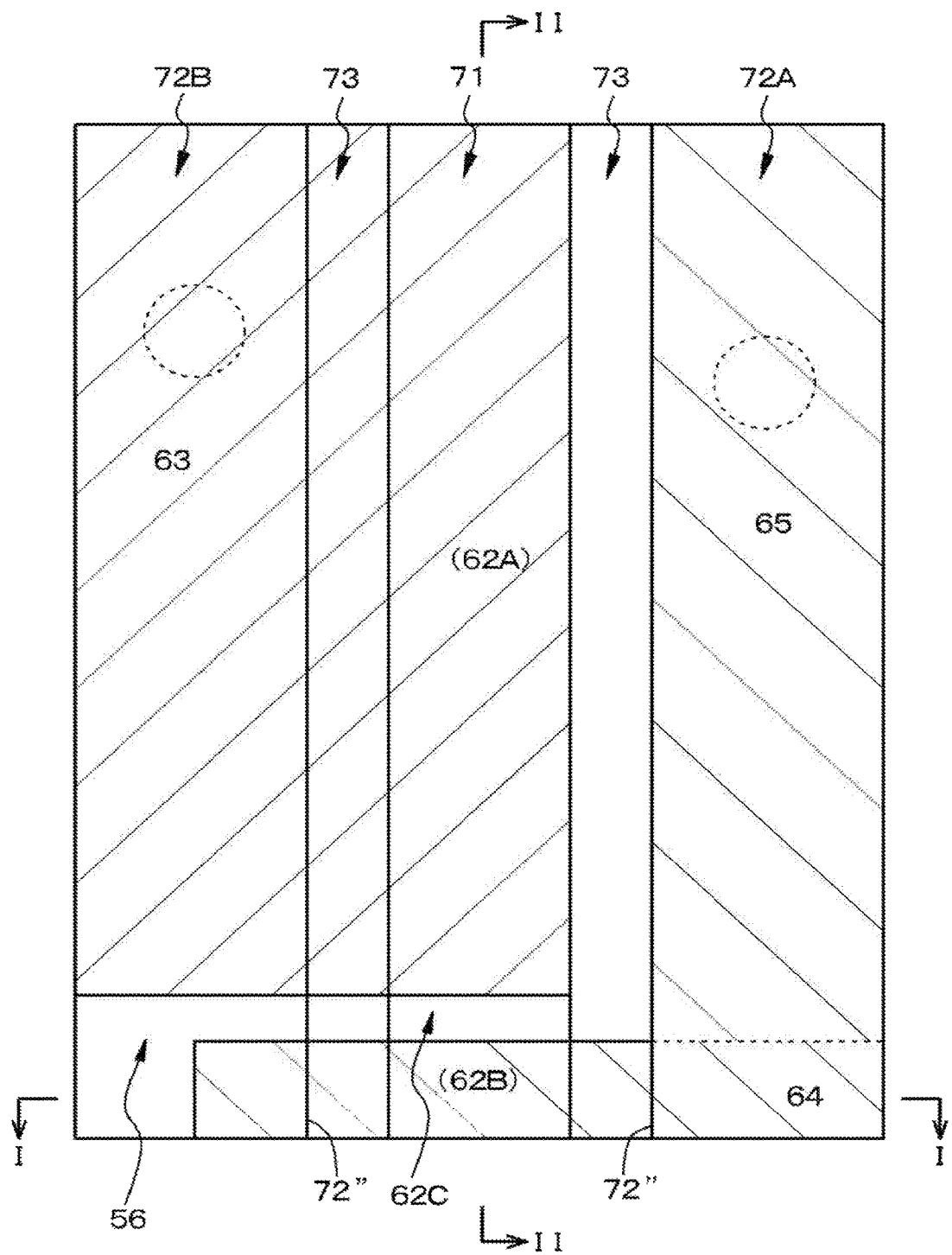
FIG. 20 is a schematic diagram of the conventional bi-section type semiconductor laser element as viewed from above.
Figure 21A:
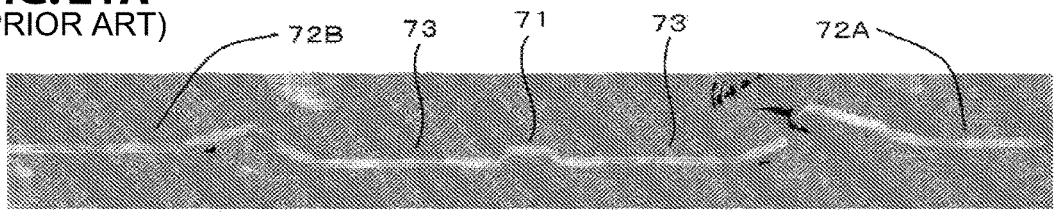
FIG. 21A, FIG. 21B, and FIG. 21C are scanning electron microscope photographs of a situation in which disconnection occurs in a second lead-out wiring layer in a conventional bi-section type semiconductor laser element.
Figure 21B:
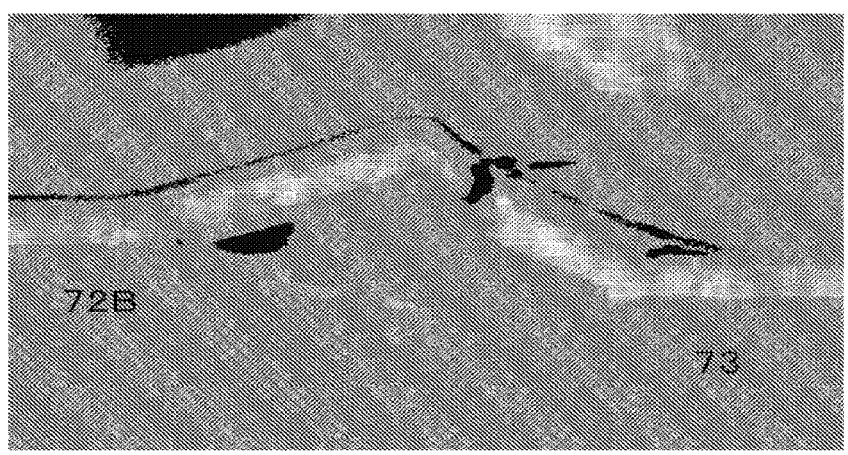
Figure 21C:
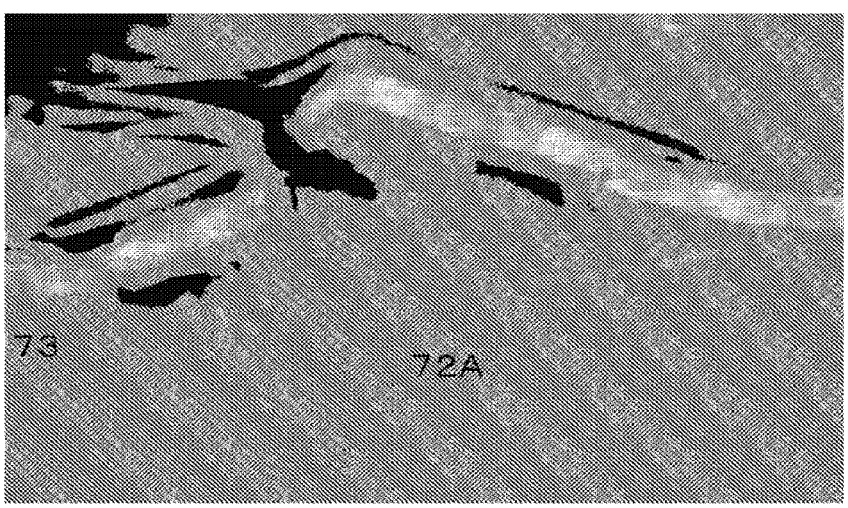
Figure 22A:
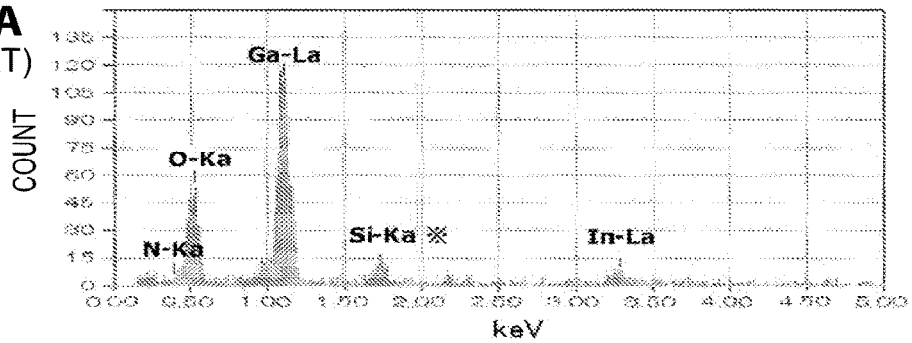
FIG. 22A, FIG. 22B, and FIG. 22C are graphs showing the results of component analysis of a volume-expanded portion etc. of a compound semiconductor layer in the conventional bi-section type semiconductor laser element.
Figure 22B:
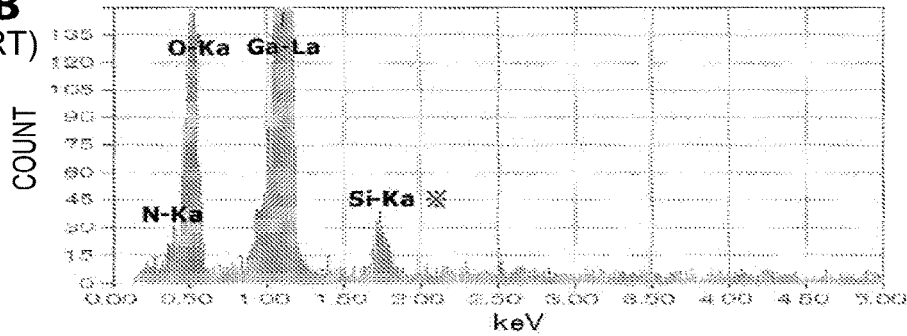
Figure 22C:
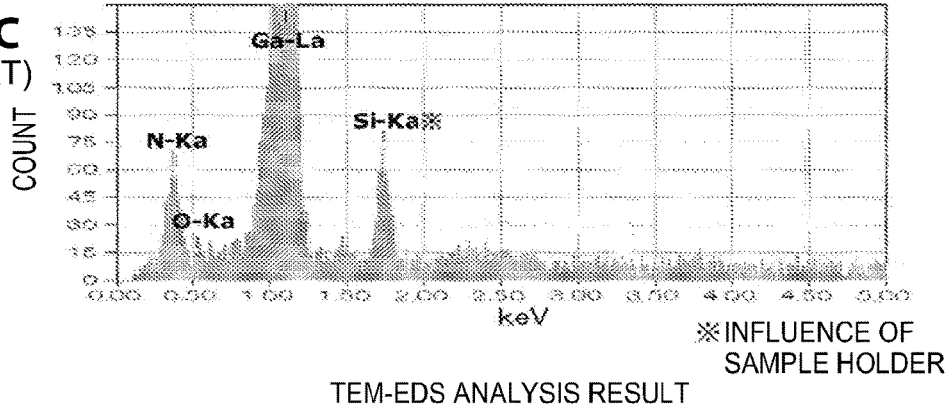
Figure 23:
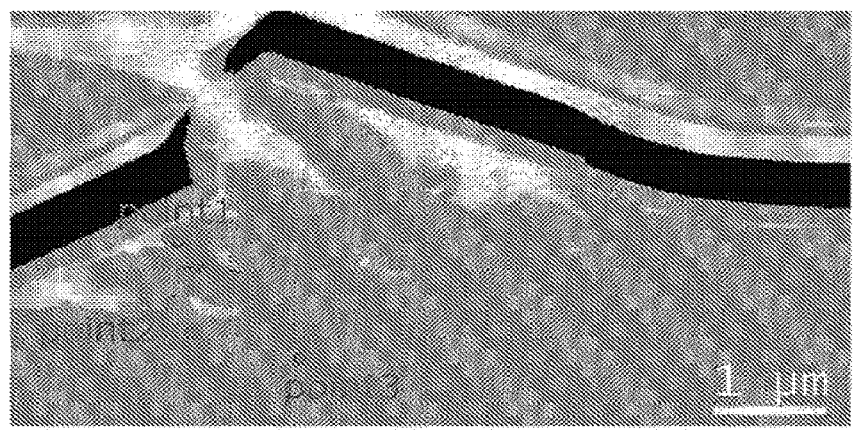
FIG. 23 is a scanning electron microscope photograph showing a portion of the sample where the component analysis results shown in FIG. 22A, FIG. 22B, and FIG. 22C are obtained.

Continuous operation tests of the semiconductor laser element of Example 1 and a semiconductor laser element of Comparative Example 1 that has the same configuration and structure as the semiconductor laser element of Example 1 except for not including the protection electrode were performed. Specifically, $V_{sa}$ was set to $V_{sa}$=−11 volts. Here, the current flowing from the second electrode 62 to the first electrode 61 via the light emitting region 41 (forward bias current $I_{gain}$) was 90 milliamperes in Example 1 and 105 milliamperes in Comparative Example 1. The test results are shown in FIG. 15A and FIG. 15B. Here, FIG. 15A shows the average output (unit: watts), and FIG. 15B shows the photocurrent (unit: milliamperes). In Comparative Example 1, after a lapse of 330 hours from the start of the test, the mode-locking operation stopped and turned into normal laser operation. On the other hand, in Comparative Example 1, the mode-locking operation was continued and the average output was 6.7 milliwatts even after a lapse of 800 hours from the start of the test.

EXAMPLE 2

Example 2 relates to the semiconductor laser element according to the second aspect of the present disclosure. A schematic diagram of a semiconductor laser element of Example 2 as viewed from above is shown in FIG. 6, FIG. 7, FIG. 8, or FIG. 9. In FIG. 6 to FIG. 9, the first lead-out wiring layer 64, the wire bonding layer 65, and a surge protection electrode 91 are shaded in order to show them clearly, and the first portion 62A and the second portion 62B of the second electrode are shown as well. In the first lead-out wiring layer 63 and the wire bonding layer 65, a gold wire, for example, is wire-bonded to the area enclosed by the dotted circle.

In the semiconductor laser element of Example 2, like in the semiconductor laser element of Example 1, the first portion 62A of the second electrode 62 is covered by the first lead-out wiring layer 63 formed on the insulating film 56, the second portion 62B of the second electrode 62 is covered by the second lead-out wiring layer 64 formed on the insulating film 56, and the wire bonding layer 65 extending from the second lead-out wiring layer 64 is provided on the insulating film 56 formed on the one side structure body 72A. However, unlike in the semiconductor laser element of Example 1, the surge protection electrode 91 covered by the wire bonding layer 65 is formed on a portion of the one side structure body 72A located between a portion of the wire bonding layer 65 where wire bonding is made and the second lead-out wiring layer 64. The surge protection electrode 91 is made of Pd with a thickness of 0.1 µm, similarly to the second electrode 62. In the example shown in FIG. 6, the surge protection electrode 91 is formed to traverse the wire bonding layer 65 in the Y-direction. On the other hand, in the example shown in FIG. 7, a portion of the wire bonding layer 65 where wire bonding is made is surrounded by a ring-shaped surge protection electrode 91.

Otherwise, the semiconductor laser element of Example 2 has a similar configuration and structure to the semiconductor laser element of Example 1, and the semiconductor laser element of Example 2 can be manufactured by a similar manufacturing method to the method for manufacturing the semiconductor laser element described in Example 1; and a detailed description is omitted.

In the semiconductor laser element of Example 2, a surge protection electrode covered by the wire bonding layer is formed on a portion of one side structure body located between a portion of the wire bonding layer where wire bonding is made and the second lead-out wiring layer. Therefore, during the manufacturing process of the semiconductor laser element and the use of an electronic apparatus in which the semiconductor laser element is incorporated, even when a surge current resulting from an ESD current has flowed from the outside into the wire bonding layer where wire bonding is made, the surge current flows from the surge protection electrode to the first electrode via one of the side structure bodies. Thus, even when the quality of a portion of the insulating film in the shoulder area of the side structure body is low, the occurrence of insulation breakdown can be reliably prevented.

Figure 8:
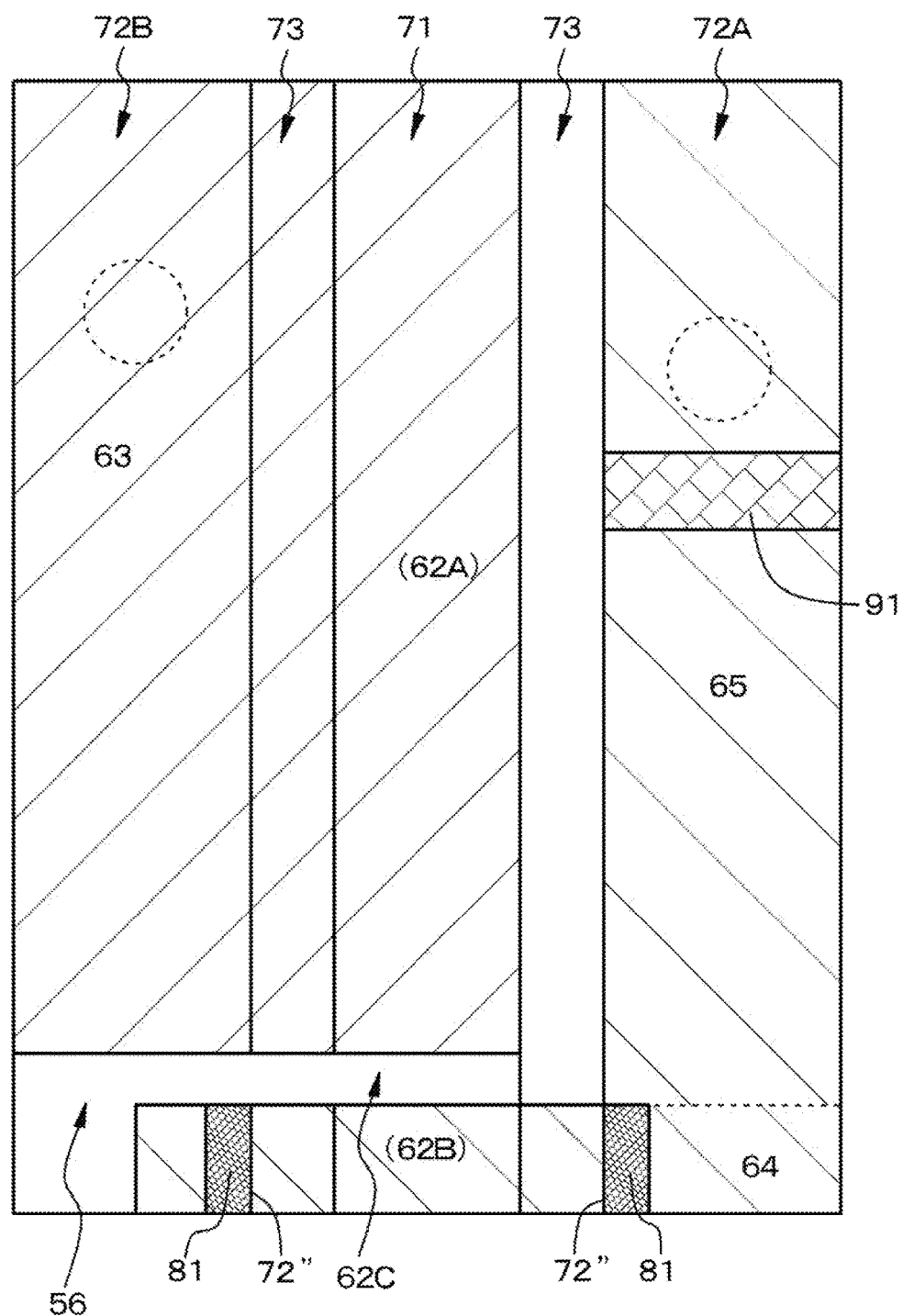
FIG. 8 is a schematic diagram of a semiconductor laser element in which the semiconductor laser elements of Example 1 and Example 2 are combined, as viewed from above.
Figure 9:
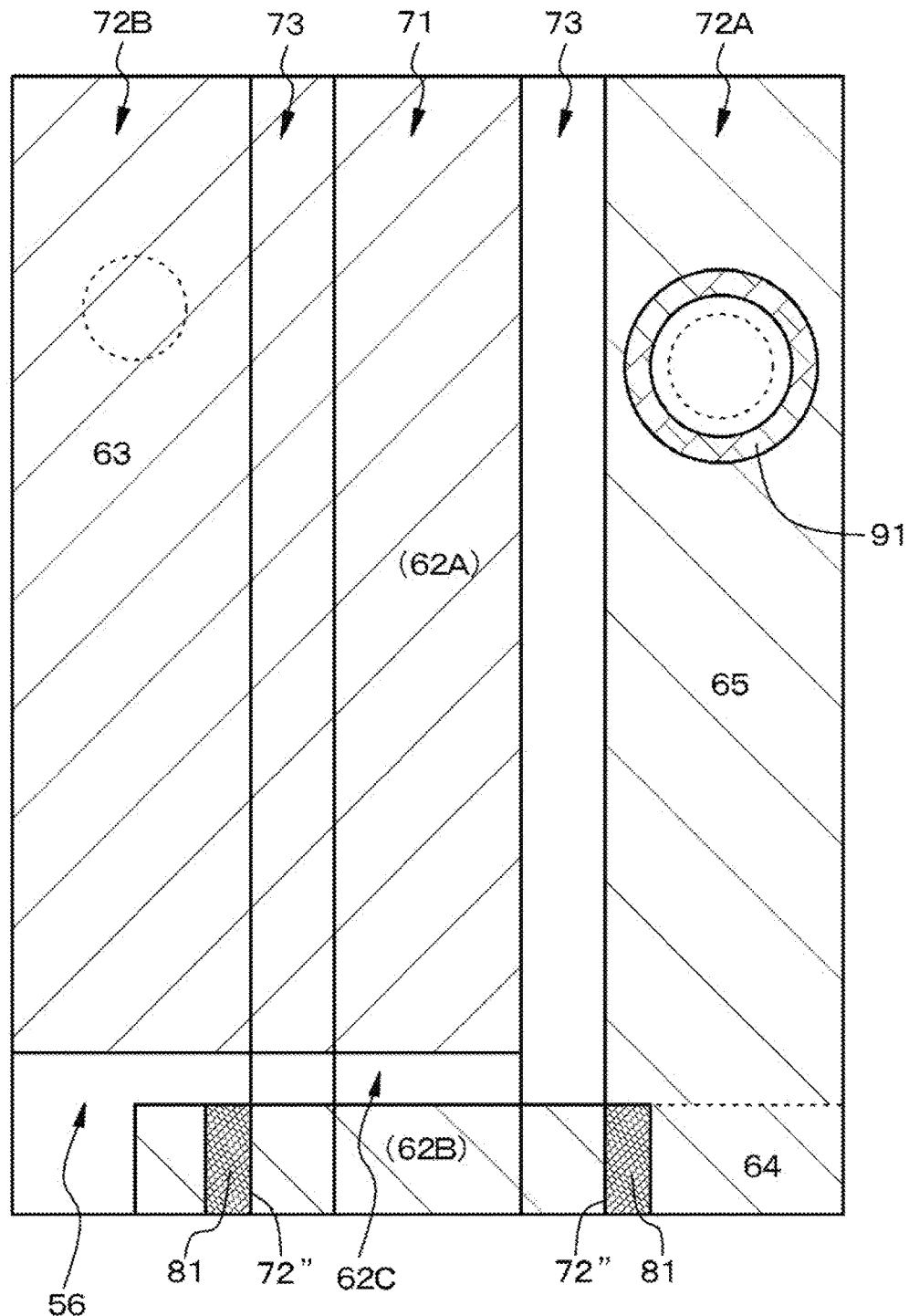
FIG. 9 is a schematic diagram of a modification example of the semiconductor laser element in which the semiconductor laser elements of Example 1 and Example 2 are combined, as viewed from above.

As shown in FIG. 8 and FIG. 9, which are schematic diagrams of semiconductor laser elements as viewed from above, the surge protection electrode 91 in Example 2 and the protection electrode 81 in Example 1 may be combined.

Hereinabove, the present disclosure is described based on preferred Examples, but the present disclosure is not limited to these Examples. The configuration of the semiconductor laser element and the configuration of the structure described in Examples are only examples, and may be altered as appropriate. Although various values are illustrated in Examples, also these are only examples and may be changed when, for example, the specifications of the semiconductor laser element used are changed, as a matter of course. Although in Examples the description is given on the basis of a semiconductor laser element having one ridge stripe structure, also what is called a multi-beam semiconductor laser element, which has a plurality of ridge stripe structures, is possible. In this case, a side structure body may be provided on both outsides of the plurality of ridge stripe structures. Furthermore, the second electrode, the protection electrode, and the surge protection electrode may be a stacked structure of a lower metal layer made of palladium (Pd) with a thickness of 20 nm and an upper metal layer made of nickel (Ni) with a thickness of 200 nm, for example. The semiconductor laser element is not limited to a mode-locking semiconductor laser element.

Semiconductor laser element assemblies that use the semiconductor laser element of the present disclosure to form an external resonator of a light condensing type to perform mode-locking operation are shown in FIG. 10A, FIG. 10B, FIG. 11A, and FIG. 11B. In the external resonator of a light condensing type shown in FIG. 10A, the external resonator is composed of an end surface of a semiconductor laser element in which a high-reflection coating layer (HR) is formed on the saturable absorption region side and an external mirror 103, and light pulses are extracted from the external mirror 103. An anti-reflection coating layer (AR) is formed on an end surface of the semiconductor laser element on the light emitting region (gain region) side (light emitting end surface). Mainly a band-pass filter is used as optical filters 102 and 112, and is inserted in order to control the oscillation wavelength of the laser. The reference numerals 101, 104, 111, and 114 represent a lens. The mode-locking is determined by the direct current applied to the light emitting region and the reverse bias voltage $V_{sa}$ applied to the saturable absorption region. The repeating frequency f of the light pulse train is determined by the external resonator length X', and is expressed by the following formula. Here, c is the speed of light, and n is the refractive index of the waveguide.

$$f=c/(2n\cdot X')$$

Figure 10A:
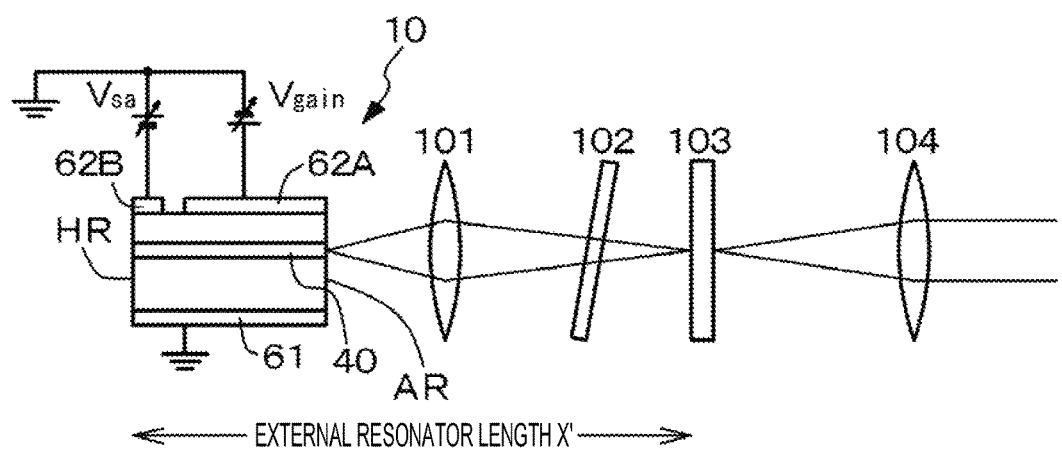
FIG. 10A and FIG. 10B are diagrams schematically showing semiconductor laser element assemblies that use the semiconductor laser element of the present disclosure to form an external resonator to perform mode-locking operation.
Figure 10B:
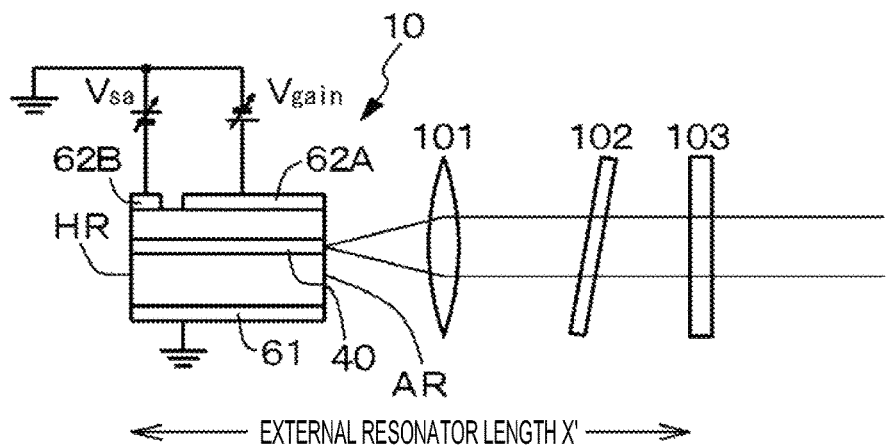

Alternatively, a modification example of the example that uses the semiconductor laser element of the present disclosure to form an external resonator is shown in FIG. 10B. Also in the external resonator of a collimating type shown in FIG. 10B, the external resonator is composed of an end surface of a semiconductor laser element in which a high-reflection coating layer (HR) is formed on the saturable absorption region side and the external mirror 103, and light pulses are extracted from the external mirror 103. An anti-reflection coating layer (AR) is formed on an end surface of the semiconductor laser element on the light emitting region (gain region) side (light emitting end surface).

Figure 11A:
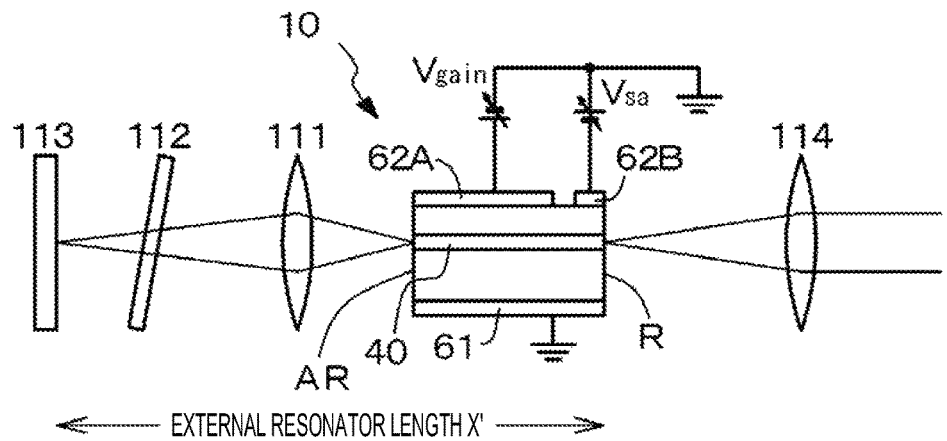
FIG. 11A, FIG. 11B, and FIG. 11C are diagrams schematically showing modification examples of the semiconductor laser element assembly that uses the semiconductor laser element of the present disclosure to form an external resonator to perform mode-locking operation.
Figure 11B:
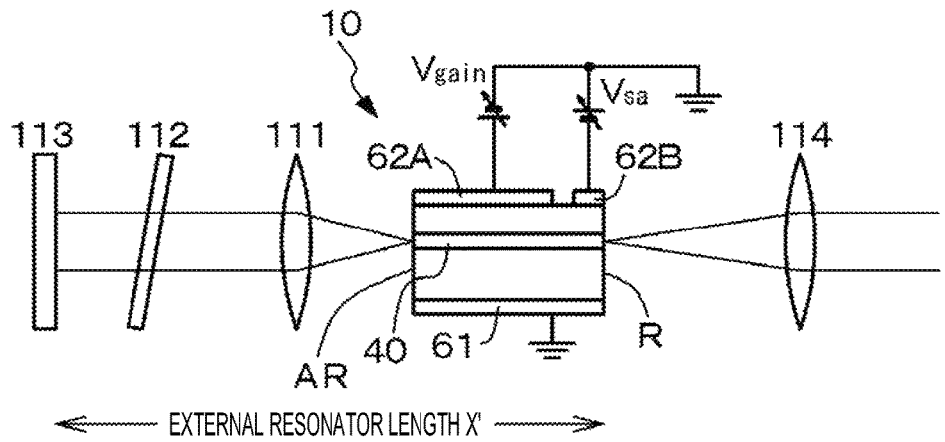
Figure 11C:
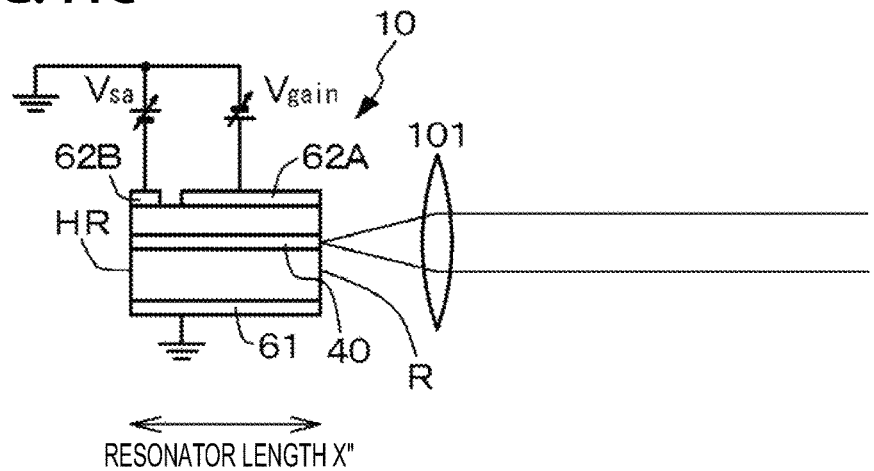

Alternatively, in the external resonators shown in FIG. 11A and FIG. 11B, the external resonator is composed of an end surface of a mode-locking semiconductor laser element in which a reflection coating layer (R) is formed on the saturable absorption region side (light emitting end surface) and an external mirror 113, and light pulses are extracted from the saturable absorption region. A low-reflection coating layer (AR) is formed on an end surface of the mode-locking semiconductor laser element on the light emitting region (gain region) side. The example shown in FIG. 11A is of a light condensing type, and the example shown in FIG. 11B is of a collimating type. Alternatively, as shown in FIG. 11C, the mode-locking semiconductor laser element may be configured as a monolithic type.

Figure 12:
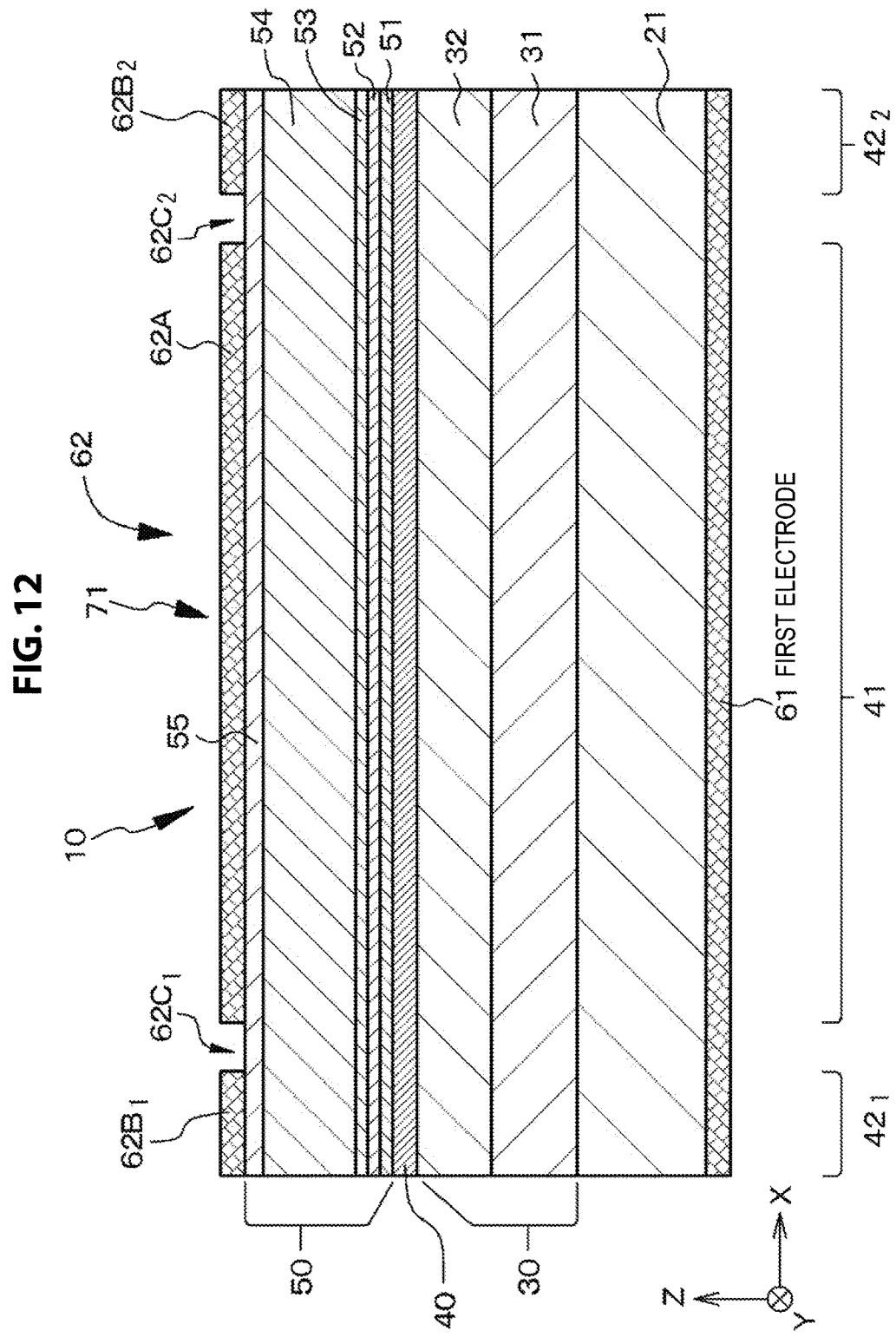
FIG. 12 is a schematic end view of a modification example of the semiconductor laser element of Example 1 along the direction in which the resonator extends.
Figure 13:
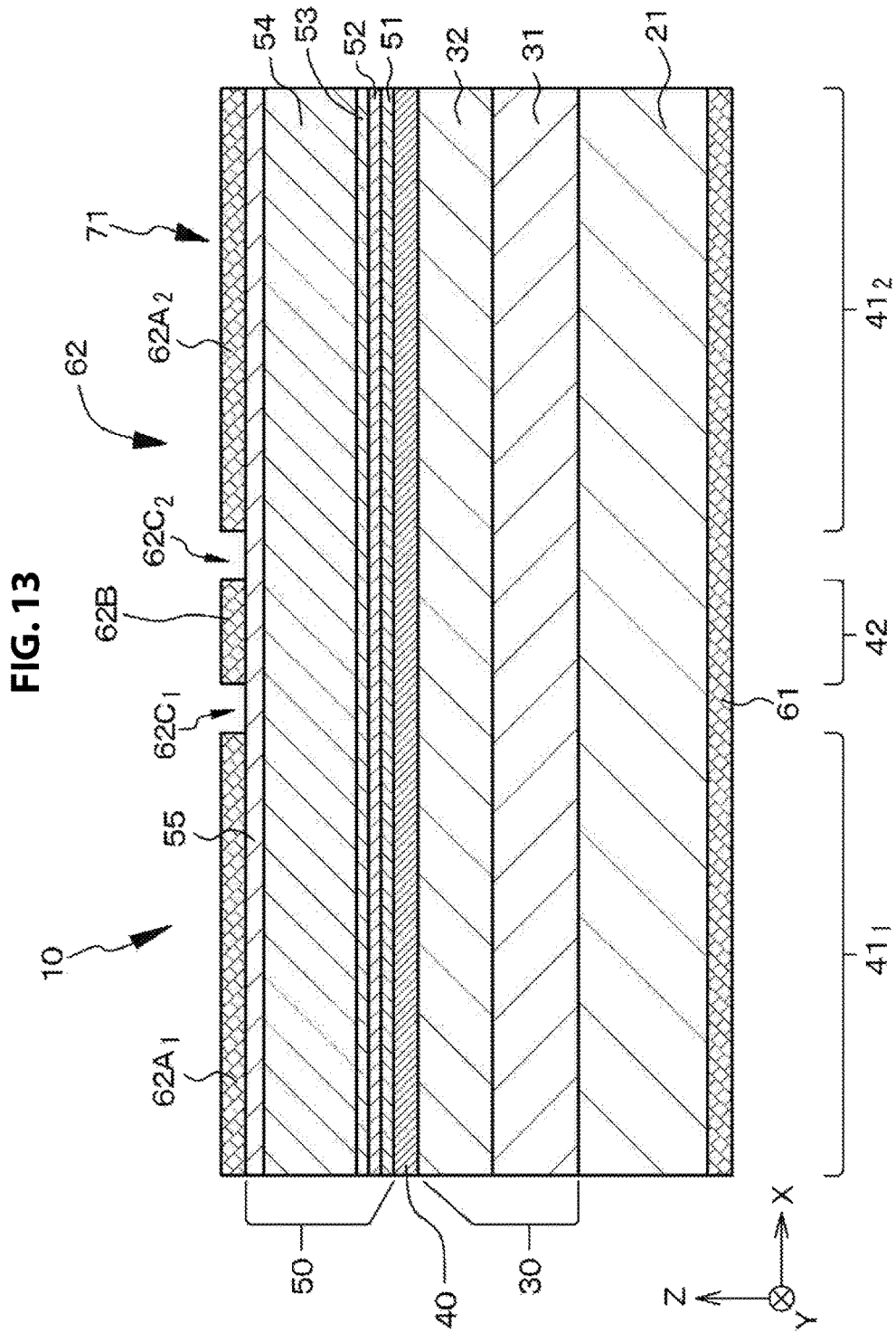
FIG. 13 is a schematic end view of another modification example of the semiconductor laser element of Example 1 along the direction in which the resonator extends.

The numbers of light emitting regions 41 and saturable absorption regions 42 are not limited to one. A schematic end view of a semiconductor laser element in which one first portion 62A of the second electrode and two second portions 62B$_1$ and 62B$_2$ of the second electrodes are provided (a schematic end view taken along the XZ plane) is shown in FIG. 12. In this semiconductor laser element, one end of the first portion 62A faces the one second portion 62B$_1$ across one isolation trench 62C$_1$, and the other end of the first portion 62A faces the other second portion 62B$_2$ across another isolation trench 62C$_2$. One light emitting region 41 is sandwiched by two saturable absorption regions 42$_1$ and 42$_2$. Alternatively, a schematic end view of a semiconductor laser element in which two first portions 62A$_1$ and 62A$_2$ of the second electrodes and one second portion 62B of the second electrode are provided (a schematic end view taken along the XZ plane) is shown in FIG. 13. In this semiconductor laser element, an end of the second portion 62B faces the one first portion 62A$_1$ across one isolation trench 62C$_1$, and the other end of the second portion 62B faces the other first portion 62A$_2$ across another isolation trench 62C$_2$. One saturable absorption region 42 is sandwiched by two light emitting regions 411 and 412.

Figure 14:
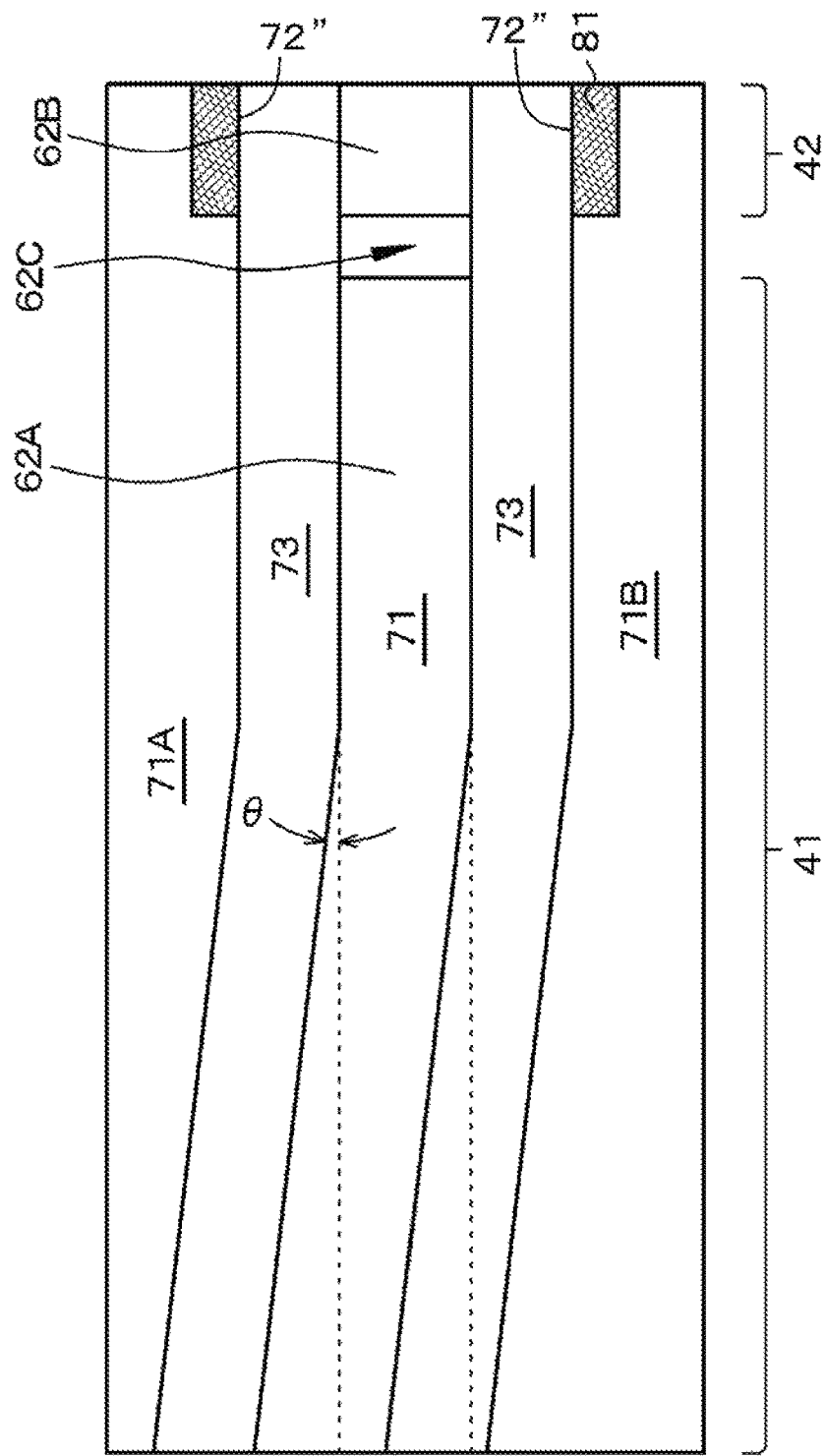
FIG. 14 is a schematic diagram of a ridge stripe structure and a side structure body in a modification example of the semiconductor laser element of Example 1 as viewed from above.

The semiconductor laser element may be configured as a semiconductor laser element of a separate confinement heterostructure of an oblique ridge stripe type having an oblique waveguide. An example in which an oblique ridge stripe structure having an oblique waveguide is used for the semiconductor laser element described in Example 1 is shown in FIG. 14, which is a schematic diagram of the ridge stripe structure 71 and the side structure body 72 as viewed from above. This semiconductor laser element has a structure in which two straight-lined ridge stripe structures are combined, and the value of the angle θ at which the two ridge stripe structures cross may be, for example, 0<θ≤10 (degrees), preferably 0<θ≤6 (degrees).

By employing an oblique ridge stripe type, the reflectance of an anti-reflection-coated end surface can be brought closer to the ideal value of 0%; consequently, advantages that the occurrence of laser light circling in the semiconductor laser element can be prevented and that the generation of incidental laser light accompanying the main laser light can be suppressed can be obtained. It goes without saying that such a semiconductor laser element can be used for the semiconductor laser element described in Example 2.

In Examples, the semiconductor laser element is provided on the c-plane, the (0001) plane, which is the polar plane of the n-type GaN substrate 21. In such a case, it may be difficult to electrically control the saturable absorption, due to the quantum-confined Stark effect (QCSE effect) by an internal electric field derived from piezoelectric polarization and spontaneous polarization in the third compound semiconductor layer. That is, depending on the circumstances, it may be necessary to increase the value of the direct current sent to the first electrode and the value of the reverse bias voltage applied to the saturable absorption region in order to obtain self-pulsation operation and mode-locking operation, subpulse components accompanying the main pulse may occur, or it may be difficult to make synchronization between the external signal and the light pulse. To suppress the occurrence of such phenomena, the semiconductor laser element may be provided on a non-polar plane such as the a-plane, which is the (11-20) plane, the m-plane, which is the (1-100) plane, or the (1-102) plane, or on a semi-polar plane such as a (11-2n) plane including the (11-24) plane and the (11-22) plane, the (10-11) plane, or the (10-12) plane. Thereby, even if piezoelectric polarization and spontaneous polarization have occurred in the third compound semiconductor layer of the semiconductor laser element, piezoelectric polarization does not occur in the thickness direction of the third compound semiconductor layer, and piezoelectric polarization occurs in a direction substantially orthogonal to the thickness direction of the third compound semiconductor layer; thus, the adverse effects due to piezoelectric polarization and spontaneous polarization can be eliminated. The (11-2n) plane refers to a non-polar plane that makes an angle of approximately 40 degrees with the c-plane. In the case where the semiconductor laser element is provided on a non-polar plane or on a semi-polar plane, it is possible to remove the limit of the thickness of the well layer (not less than 1 nm and not more than 10 nm) and the limit of the impurity doping concentration of the barrier layer (not less than $2 \times 10^{18}$ cm$^{-3}$ and not more than $1 \times 10^{20}$ cm$^{-3}$).

Additionally, the present technology may also be configured as below.

[A01] <<Semiconductor Laser Element: First Aspect>>
A semiconductor laser element including:
(a) a stacked structure body in which a first compound semiconductor layer having a first conductivity type and made of a compound semiconductor, a third compound semiconductor layer configured to form a light emitting region and a saturable absorption region made of a compound semiconductor, and a second compound semiconductor layer having a second conductivity type different from the first conductivity type and made of a compound semiconductor are sequentially stacked;
(b) a second electrode; and
(c) a first electrode electrically connected to the first compound semiconductor layer, wherein
a ridge stripe structure formed of at least part of the stacked structure body is formed,
a side structure body formed of the stacked structure body is formed on both sides of the ridge stripe structure,
the second electrode formed on the second compound semiconductor layer forming the ridge stripe structure is separated into a first portion for sending a direct current to the first electrode via the light emitting region to create a forward bias state and a second portion for applying an electric field to the saturable absorption region,
a protection electrode is formed on a portion adjacent to the second portion of the second electrode of at least one of the side structure bodies, and
an insulating film made of an oxide insulating material is formed to extend from on a portion of the ridge stripe structure to on a portion of the side structure body, on which portions neither the second electrode nor the protection electrode is formed.

[A02] The semiconductor laser element according to [A01], wherein the oxide insulating material is made of SiO$_x$.

[A03] The semiconductor laser element according to [A01], wherein the oxide insulating material is at least one material selected from the group consisting of aluminum oxide, tantalum oxide, and zirconium oxide.

[A04] The semiconductor laser element according to [A01], wherein the oxide insulating material is at least one material selected from the group consisting of ZnO$_x$, SiON, HfO$_x$, ScO$_x$, YO$_x$, MgO$_x$, ThO$_x$, and BiO$_x$.

[A05] The semiconductor laser element according to any one of [A01] to [A04], wherein
the first portion of the second electrode is covered by a first lead-out wiring layer formed on the insulating film, and the second portion of the second electrode and the protection electrode are covered by a second lead-out wiring layer formed on the insulating film.

[A06] The semiconductor laser element according to [A05], wherein the first lead-out wiring layer and the second lead-out wiring layer are formed, being spaced from each other, to extend from on the ridge stripe structure to on the side structure body.

[A07] The semiconductor laser element according to [A06], wherein a wire bonding layer extending from the second lead-out wiring layer is provided on the insulating film formed on one of the side structure bodies.

[A08] The semiconductor laser element according to [A07], wherein a surge protection electrode covered by the wire bonding layer is formed on a portion of the one of the side structure bodies located between a portion of the wire bonding layer where wire bonding is made and the second lead-out wiring layer.

[A09] The semiconductor laser element according to any one of [A01] to [A08], wherein a light reflecting end surface and a light emitting end surface are provided, and the second portion of the second electrode is provided near the light reflecting end surface.

[A10] The semiconductor laser element according to any one of [A01] to [A09], wherein the stacked structure body is made of a GaN-based compound semiconductor.

[B01] <<Semiconductor Laser Element: Second Aspect>>

A semiconductor laser element including:

(a) a stacked structure body in which a first compound semiconductor layer having a first conductivity type and made of a compound semiconductor, a third compound semiconductor layer configured to form a light emitting region and a saturable absorption region made of a compound semiconductor, and a second compound semiconductor layer having a second conductivity type different from the first conductivity type and made of a compound semiconductor are sequentially stacked;

(b) a second electrode; and (c) a first electrode electrically connected to the first compound semiconductor layer, wherein a ridge stripe structure formed of at least part of the stacked structure body is formed, a side structure body formed of the stacked structure body is formed on both sides of the ridge stripe structure, the second electrode formed on the second compound semiconductor layer forming the ridge stripe structure is separated into a first portion for sending a direct current to the first electrode via the light emitting region to create a forward bias state and a second portion for applying an electric field to the saturable absorption region, the first portion of the second electrode is covered by a first lead-out wiring layer formed on an insulating film, the second portion of the second electrode is covered by a second lead-out wiring layer formed on the insulating film, a wire bonding layer extending from the second lead-out wiring layer is provided on the insulating film formed on one of the side structure bodies, and a surge protection electrode covered by the wire bonding layer is formed on a portion of the one of the side structure bodies located between a portion of the wire bonding layer where wire bonding is made and the second lead-out wiring layer.

REFERENCE SIGNS LIST 10 semiconductor laser element
21 n-type GaN substrate
30 first compound semiconductor layer
31 n-type AlGaN cladding layer
32 n-type GaN cladding layer
40 third compound semiconductor layer (active layer)
41, $41_1$, $41_2$ light emitting region
42, $42_1$, $42_2$ saturable absorption region
50 second compound semiconductor layer
51 non-doped GaInN light guide layer
52 non-doped AlGaN cladding layer
53 p-type AlGaN electron barrier layer (Mg-doped)
54 p-type GaN (Mg-doped)/AlGaN superlattice cladding layer
55 p-type GaN contact layer (Mg-doped)
56 insulating film
56A low-quality portion of the insulating film
61 first electrode
62 second electrode
62A, $62A_1$, $62A_2$ first portion of the second electrode
62B, $62B_1$, $62B_2$ second portion of the second electrode
62C, $62C_1$, $62C_2$ isolation trench
63 first lead-out wiring layer
64 second lead-out wiring layer
65 wire bonding layer
71 ridge stripe structure
72 side structure body
72' portion adjacent to (facing) the second portion of the second electrode
72" shoulder of the side structure body
73 recess provided between the ridge stripe structure and the side structure body
81 protection electrode
91 surge protection electrode
101, 104, 111, 114 lens
102, 112 optical filter
103, 113 external mirror

The invention claimed is:

1. A semiconductor laser element comprising:

(a) a stacked structure body in which a first compound semiconductor layer having a first conductivity type and made of a compound semiconductor, a third compound semiconductor layer configured to form a light emitting region and a saturable absorption region made of a compound semiconductor, and a second compound semiconductor layer having a second conductivity type different from the first conductivity type and made of a compound semiconductor are sequentially stacked;

(b) a second electrode; and (c) a first electrode electrically connected to the first compound semiconductor layer, wherein a ridge stripe structure formed of at least part of the stacked structure body is formed, a side structure body formed of the stacked structure body is formed on both sides of the ridge stripe structure, the second electrode formed on the second compound semiconductor layer forming the ridge stripe structure is separated into a first portion for sending a direct current to the first electrode via the light emitting region to create a forward bias state and a second portion for applying an electric field to the saturable absorption region, a protection electrode is formed on a portion adjacent to the second portion of the second electrode of at least one of the side structure bodies, and an insulating film made of an oxide insulating material is formed to extend from on a portion of the ridge stripe structure to on a portion of the side structure body, on which portions neither the second electrode nor the protection electrode is formed.

2. The semiconductor laser element according to claim 1, wherein the oxide insulating material is made of $SiO_x$.

3. The semiconductor laser element according to claim 1, wherein
the first portion of the second electrode is covered by a first lead-out wiring layer formed on the insulating film, and
the second portion of the second electrode and the protection electrode are covered by a second lead-out wiring layer formed on the insulating film.

4. The semiconductor laser element according to claim 3, wherein the first lead-out wiring layer and the second lead-out wiring layer are formed, being spaced from each other, to extend from on the ridge stripe structure to on the side structure body.

5. The semiconductor laser element according to claim 4, wherein a wire bonding layer extending from the second lead-out wiring layer is provided on the insulating film formed on one of the side structure bodies.

6. The semiconductor laser element according to claim 5, wherein a surge protection electrode covered by the wire bonding layer is formed on a portion of the one of the side structure bodies located between a portion of the wire bonding layer where wire bonding is made and the second lead-out wiring layer.

7. The semiconductor laser element according to claim 1, wherein
a light reflecting end surface and a light emitting end surface are provided, and
the second portion of the second electrode is provided near the light reflecting end surface.

8. The semiconductor laser element according to claim 1, wherein the stacked structure body is made of a GaN-based compound semiconductor.

9. A semiconductor laser element comprising:
(a) a stacked structure body in which a first compound semiconductor layer having a first conductivity type and made of a compound semiconductor, a third compound semiconductor layer configured to form a light emitting region and a saturable absorption region made of a compound semiconductor, and a second compound semiconductor layer having a second conductivity type different from the first conductivity type and made of a compound semiconductor are sequentially stacked;
(b) a second electrode; and
(c) a first electrode electrically connected to the first compound semiconductor layer, wherein
a ridge stripe structure formed of at least part of the stacked structure body is formed,
a side structure body formed of the stacked structure body is formed on both sides of the ridge stripe structure,
the second electrode formed on the second compound semiconductor layer forming the ridge stripe structure is separated into a first portion for sending a direct current to the first electrode via the light emitting region to create a forward bias state and a second portion for applying an electric field to the saturable absorption region,
the first portion of the second electrode is covered by a first lead-out wiring layer formed on an insulating film,
the second portion of the second electrode is covered by a second lead-out wiring layer formed on the insulating film,
a wire bonding layer extending from the second lead-out wiring layer is provided on the insulating film formed on one of the side structure bodies, and
a surge protection electrode covered by the wire bonding layer is formed on a portion of the one of the side structure bodies located between a portion of the wire bonding layer where wire bonding is made and the second lead-out wiring layer.

* * * * *